(12) United States Patent
Wegener

(10) Patent No.: US 8,301,803 B2
(45) Date of Patent: Oct. 30, 2012

(54) BLOCK FLOATING POINT COMPRESSION OF SIGNAL DATA

(75) Inventor: Albert W. Wegener, Portola Valley, CA (US)

(73) Assignee: Samplify Systems, Inc., Campbell, CA (US)

( * ) Notice: Subject to any disclaimer, the term of this patent is extended or adjusted under 35 U.S.C. 154(b) by 455 days.

(21) Appl. No.: 12/605,245

(22) Filed: Oct. 23, 2009

(65) Prior Publication Data

US 2011/0099295 A1 Apr. 28, 2011

(51) Int. Cl.
*G06F 15/16* (2006.01)
*G06F 7/00* (2006.01)
*H04L 9/32* (2006.01)
*H04N 7/167* (2011.01)

(52) U.S. Cl. ......... 709/247; 708/203; 713/172; 380/229

(58) Field of Classification Search .................. 709/247; 708/203; 713/172; 380/229
See application file for complete search history.

(56) References Cited

U.S. PATENT DOCUMENTS

| | | | |
|---|---|---|---|
| 5,220,523 A | 6/1993 | Yoshida et al. |
| 5,751,771 A | 5/1998 | Katsumata et al. |
| 5,839,100 A | 11/1998 | Wegener |
| 5,933,360 A | 8/1999 | Larson |
| 6,021,386 A | 2/2000 | Davis et al. |
| 6,028,893 A | 2/2000 | Schreib |
| 6,148,317 A | 11/2000 | Riddle et al. |
| 6,807,528 B1 | 10/2004 | Truman et al. |
| 7,554,464 B1 | 6/2009 | Oberdorfer |
| 2007/0257824 A1 | 11/2007 | Harada et al. |
| 2008/0154999 A1 | 6/2008 | Sardana et al. |
| 2009/0290632 A1 | 11/2009 | Wegener |
| 2010/0061505 A1 | 3/2010 | Wegener et al. |
| 2010/0070836 A1 | 3/2010 | Wegener et al. |
| 2010/0128949 A1 | 5/2010 | Wegener et al. |
| 2010/0128998 A1 | 5/2010 | Wegener et al. |

OTHER PUBLICATIONS

Search Report from PCT/US2010/053809 mailed Jul. 29, 2011, 9 pages.
Christensen, E.L., "Block Floating Point for Radar Data," IEEE Transactions on Aerospace and Electronic Systems, vol. 35, No. 1, pp. 308-318, Jan. 1999.
Huneycutt, B.L., "Spaceborne Imaging Radar—C Instrument," in IEEE Transactions on Geoscience and Remote Sensing, vol. 27, No. 2, pp. 164-169, Mar. 1989.
Kobayashi, S. and G.B. Fettiweis, "A New Approach for Block-Floating-Point Arithmetic," Proceedings of the IEEE International Conference on Acoustics, Speech, and Signal Processing (ICASSP'99), vol. 4, pp. 2009-2012, Mar. 1999.
Mitra, A., "On Finite Wordlength Properties of Block-Floating-Point Arithmetic," International Journal of Signal Processing 2;2, pp. 120-125, Spring 2006.
Hayakawa, K., "A fast and small audio encoding circuits usingblock-floating-point arithmetic and dataflow optimization," <http://www.is.nagoya-u.ac.jp/thesis/M2007/i/M350602182e.pdf>, 2007.
Wegener, A., "Compression of Baseband Signals in Base Transceiver Systems," U.S. Appl. No. 12/124,382, filed May 21, 2008, 69 pages.
Wegener Albert et al., "Ultrasound Signal Compression,", U.S. Appl. No. 12/477,062, filed Jun. 2, 2009, 72 pages.
Wegener, A., "Post-Beamforming Compression in Ultrasound Systems", U.S. Appl. No. 12/494,184, filed Jun. 29, 2009, 73 pages.

*Primary Examiner* — Ranodhi Serrao
(74) *Attorney, Agent, or Firm* — Haynes Beffel & Wolfeld LLP; Carolyn Koenig

(57) ABSTRACT

A method and apparatus for compressing signal samples uses block floating point representations where the number of bits per mantissa is determined by the maximum magnitude sample in the group. The compressor defines groups of signal samples having a fixed number of samples per group. The maximum magnitude sample in the group determines an exponent value corresponding to the number of bits for representing the maximum sample value. The exponent values are encoded to form exponent tokens. Exponent differences between consecutive exponent values may be encoded individually or jointly. The samples in the group are mapped to corresponding mantissas, each mantissa having a number of bits based on the exponent value. Removing LSBs depending on the exponent value produces mantissas having fewer bits. Feedback control monitors the compressed bit rate and/or a quality metric. This abstract does not limit the scope of the invention as described in the claims.

35 Claims, 24 Drawing Sheets

| Exps per Token | Encoding technique | Exp diff(s) {diff(i), diff(i-1)} or Absolute exp(i) | Exponent Token (hex) | Token Length (# bits) | Bits per Exp |
|---|---|---|---|---|---|
| (A) | | | | | |
| 2 | DIFF (2 EXPS) | {-1, -1} | 0x0 | 4 | 2 |
| 2 | DIFF (2 EXPS) | { 0, -1} | 0x1 | 4 | 2 |
| 2 | DIFF (2 EXPS) | {+1, -1} | 0x2 | 4 | 2 |
| 2 | DIFF (2 EXPS) | {-1, 0} | 0x3 | 4 | 2 |
| 2 | DIFF (2 EXPS) | { 0, 0} | 0x4 | 4 | 2 |
| 2 | DIFF (2 EXPS) | {+1, 0} | 0x5 | 4 | 2 |
| 2 | DIFF (2 EXPS) | {-1, +1} | 0x6 | 4 | 2 |
| 2 | DIFF (2 EXPS) | { 0, +1} | 0x7 | 4 | 2 |
| 2 | DIFF (2 EXPS) | {+1, +1} | 0x8 | 4 | 2 |
| (B) | | | | | |
| 1 | DIFF (1 EXP) | -2 | 0x9 | 4 | 4 |
| 1 | DIFF (1 EXP) | -1 | 0xA | 4 | 4 |
| 1 | DIFF (1 EXP) | 0 | 0xB | 4 | 4 |
| 1 | DIFF (1 EXP) | +1 | 0xC | 4 | 4 |
| 1 | DIFF (1 EXP) | +2 | 0xD | 4 | 4 |
| (C) | | | | | |
| 1 | ABS (1 EXP) | {0,2,3, ... 32} | 111aaaaa | 8 | 8 |

Figure 4

| Blk # | Samples | Max mag | Exponent n_exp(i) + sign bit | Exp diff diff(i) | Joint Exp Token (binary) | Bits/ exp token |
|---|---|---|---|---|---|---|
| 1 | {6874, -392, -42, 18} | 6874 | 14 | (abs) | 1110 1110 (C) | 8 |
| 2 | {-29, 43, -1, -44} | 44 | 7 | (abs) | 1110 0111 (C) | 8 |
| 3 | {32, 40, -24, -30} | 40 | 7 | 0 | diff(i-1) = 0 (A) | - |
| 4 | {120, 16, 18, -46} | 120 | 8 | +1 | {+1, 0} → 01 01 (A) | 4 |
| 5 | {51, 5, -6, -1} | 51 | 7 | -1 | diff(i-1) = -1 (A) | - |
| 6 | {-29, 58, -17, -1} | 58 | 7 | 0 | {0, -1} → 00 01 (A) | 4 |
| 7 | {12, 60, 111, 50} | 111 | 8 | +1 | {+1} → 1100 (B) | 4 |
| 8 | {6, -16, 4, 30} | 30 | 6 | -2 | {-2} → 1001 (B) | 4 |

Figure 6

| n_exp | n_LSB | m_exp |
|---|---|---|
| 0 | 0 | 0 |
| 2 | 0 | 2 |
| 3 | 0 | 3 |
| 4 | 1 | 3 |
| 5 | 1 | 4 |
| 6 | 1 | 5 |
| 7 | 1 | 6 |
| 8 | 2 | 6 |
| 9 | 2 | 7 |
| 10 | 2 | 8 |
| 11 | 2 | 9 |
| 12 | 3 | 9 |
| 13 | 3 | 10 |
| 14 | 4 | 10 |

Figure 9

BLOCK FLOATING POINT COMPRESSION OF SIGNAL DATA

BACKGROUND OF THE INVENTION

The present invention relates to compression and decompression of signal data using efficient encoding of block floating point representations, and more particularly to block floating point encoding to reduce the numbers of bits representing signal samples to achieve a desired output data rate or a desired quality metric.

Compression of signal data enables more efficient use of resources in signal or image processing applications where it is desirable to maintain accurate information while decreasing the amount of signal data. Compressing the signal data reduces the data storage capacity requirements of a memory or other storage device in the system. Compressing the signal data reduces bandwidth requirements for a data transfer interface in the system. Computationally efficient operations for compression and decompression lower the impact on system computing resources and latency.

Block floating point representations in signal processing have an advantage of increasing the dynamic range that can be represented by a limited number of bits. A block floating point representation may cover a wide dynamic range while maintaining accuracy of signal data. In a typical block floating point representation, a common exponent is determined for a group of samples based on the largest magnitude sample in the group. The mantissa for each sample in the group is represented by the number of bits that accommodates the mantissa of the largest sample. The bits representing the common exponent and the mantissas for the group may be packed consecutively to represent compressed samples for the group. Block floating point representations are useful for signal dynamics where the amplitudes fluctuate over time yet neighboring samples have similar amplitudes in a particular group. Several signal types have these dynamics. Examples include pulsed signals that decay over time, such as radar, sonar and ultrasound signals.

The following patents describe compression using block floating point data representations for various applications.

In the U.S. Pat. No. 5,751,771 entitled "Waveform Data Compression Apparatus and Waveform Data Expansion Apparatus," issued May 12, 1998, Katsumata et al. describe block by block compression of a sampled signal using block floating point representations. For each block of signal samples, a number of arithmetic means are calculated between a pattern of pairs of non-adjacent samples. The arithmetic mean of a pair of samples represents an estimate of the intermediate sample halfway between the pair of samples. The distances between the pairs of samples decreases for the arithmetic means calculated for the block according to a pattern, i.e. the pair of end samples of the block, the end sample and the middle sample in the block, etc. The arithmetic means are subtracted from the corresponding intermediate sample values to form difference samples. The mantissas of difference samples are assigned numbers of bits for encoding based on their index (address) in the block, so that the encoded mantissas for one block have different lengths. The mantissa of last sample in the block is linearly encoded using a fixed number of bits. The exponent for the block is determined using a formula based on the maximum number of left-shifts such that the upper two bits are "01" or "10," which effectively removes any sign extension bits. The mantissas of the difference samples and the last sample are left-shifted and rounded to remove least significant bits (LSBs) to fit the numbers of bits assigned to the mantissas of the block. The block of compressed data includes the encoded exponent and the encoded mantissas. In other embodiments, other samples in addition to the last sample may be linearly encoded instead of encoding the difference sample. Other embodiments include more complex patterns of mantissa lengths and linear versus difference encoding for samples within the same block. These embodiments include a pattern code for the block indicating the pattern of mantissa lengths, the exponent and linear versus difference encoding based on the sample index in the block.

In the U.S. Pat. No. 6,021,386 entitled "Coding Method and Apparatus for Multiple Channels of Audio Information Representing Three-Dimensional Sound Fields," issued Feb. 1, 2000, Davis et al. describe block floating point encoding of the transform coefficients of audio signals. A discrete transform such as the Discrete Fourier Transform (DFT) applied to the sampled audio signal produces the transform coefficients. The transform coefficients are grouped into subbands, or blocks, of consecutive transform coefficients. A common exponent for the block is determined based on the largest spectral component in the subband. In one embodiment, groups of subbands are assigned master exponents to increase the dynamic range of the block floating point representation. The master exponent represents a minimum exponent value for all the exponents in the group of subbands and the subband exponent represents the difference between the master exponent and the exponent of the largest transform coefficient in the subband. A quantizer left-shifts the mantissas for the subband in accordance with the subband exponent and the master exponent and truncates LSBs to represent the mantissas with a bit length corresponding to a bit allocation for the subband. An adaptive bit allocator assigns a number of bits for each subband. In a preferred embodiment, the bit allocation is based on the amplitudes of the spectral components in the subband.

Christensen describes block floating point representations of synthetic aperture radar (SAR) data in the article entitled "Block Floating Point for Radar Data," IEEE Transactions on Aerospace and Electronic Systems, Vol. 35, No. 1, pp. 308-18, January 1999. The article presents a theoretical analysis of the performance of block floating point representations in terms of signal to noise ratio (SNR) versus encoding parameters such as block size, quantization step size and number of bits for representing the block exponent. The SNR performances of block floating point on SAR data using fixed numbers of bits per block are also presented.

Huneycutt describes a block floating point representation of imaging radar data in the article entitled "Spaceborne Imaging Radar—C Instrument," in IEEE Transactions on Geoscience and Remote Sensing, Vol. 27, No 2, pp. 164-9, March 1989. The system includes a block floating point quantizer (BFPQ) that encodes 8-bit data samples using the four most significant bits per sample followed by a common exponent for each block of samples.

The following patents and articles describe using floating point representations on a sample by sample basis (in contrast to the block by block basis described above) to compress signal data in various applications.

In the U.S. Pat. No. 5,933,360 entitled "Method and Apparatus for Signal Compression and Processing Using Logarithmic Differential Compression, issued Aug. 3, 1999, Larson describes logarithmic differential compression (LDC) for representing a sampled signal in a floating point format using fewer bits per sample. Signal processing calculations such as filtering are applied to the compressed samples prior to decompression. The logarithmic differential compression includes calculating a first derivative of the signal before or after analog to digital conversion to produce derivative samples. The lower magnitudes of derivative samples allow them to be represented by fewer bits. Each derivative sample is represented in a floating point format having a sign bit, an exponent field and a mantissa field to form a sample of the compressed signal. The lengths of the mantissa field and the exponent field in the floating point representation are the same for all the derivative samples and may be selected to suit a specific application, such as audio and video signals. Since the LDC algorithm is linear, continuous in time and applied on a sample by sample basis, signal processing operations such as filtering and transforms may be applied directly to the compressed data prior to decompression. Since the floating point representation of a LDC sample approximates a logarithmic (base 2), the complexity of hardware or software implementations for signal processing operations on the compressed data can be reduced. For example, a multiplication in the logarithmic domain is performed by adding the LDC samples. The LDC data may be further compressed by applying other techniques of compression, such as run length encoding, Huffman, LZW (Lemple-Ziv-Welch), etc. The LDC method uses the same floating point format for all samples, i.e. the format is not varied over blocks of data. Each LDC sample includes an exponent field and a mantissa field, i.e. the exponent is not shared among the mantissas in a block of encoded data.

The present inventor describes adaptations of block floating point representations for compression of sampled signals for several applications. In the commonly owned U.S. Pat. No. 5,839,100 (the '100 patent) entitled "Lossless and Loss-Limited Compression of Sampled Data Signals," issued Nov. 17, 1998, the present inventor describes a block floating point encoder applied to derivative samples of a sampled signal. The derivative samples are first or higher order derivatives among consecutive samples of the sampled signal. In one embodiment, the block floating point encoder determines the exponent for each block based on the maximum derivative sample. A Huffman encoder assigns codes to the exponents for the blocks based on the frequency of occurrence of the exponent value. The encoded exponents for a sequence of blocks are packed into an exponent array. A mantissa generator encodes the mantissas for a given block using the number of bits specified by the exponent value for that block. The encoded mantissas are packed into a mantissa array.

Several co-owned US applications include adaptations of block floating point encoding for various types of signals and systems. These include U.S. patent application Ser. No. 12/124,312 entitled, "Compression of Baseband Signals in Base Transceiver Systems," filed May 21, 2008; U.S. patent application Ser. No. 12/124,541 entitled "Compression of Signals in Base Transceiver Systems," filed May 21, 2008; U.S. patent application Ser. No. 12/208,839 entitled "Adaptive Compression of Computed Tomography Projection Data," filed Sep. 11, 2008; U.S. patent application Ser. No. 12/208,835 entitled "Edge Detection for Computed Tomography Projection Data Compression," filed Sep. 11, 2008; U.S. patent application Ser. No. 12/352,116 entitled "Compression and Storage of Projection Data in a Computed Tomography System," U.S. patent application Ser. No. 12/352,222 entitled "Compression and Storage of Projection Data in a Rotatable Part of a Computed Tomography System," filed Jan. 12, 2008, U.S. patent application Ser. No. 12/477,062 entitled "Ultrasound Signal Compression," filed Jun. 2, 2009; and U.S. patent application Ser. No. 12/494,184 entitled "Post-Beamforming Compression in Ultrasound Systems" filed Jun. 29, 2009,

SUMMARY OF THE INVENTION

Embodiments of the present invention provide enhanced block floating point compression of sampled signal data with control features to allow a fixed output data rate of compressed samples or a fixed quality metric. An object of the present invention is to provide a method for compressing a plurality of signal samples, where the signal samples consist of a number of bits per sample. The method comprises:

grouping the plurality of signal samples into a sequence of encoding groups;

for an encoding group in the sequence of encoding groups, determining a block exponent value for the encoding group, and determining a mantissa for each signal sample in the encoding group, the mantissa having a number of bits based on said exponent value for the encoding group;

for the sequence of encoding groups, encoding the block exponent values for the encoding groups to determine exponent tokens for the encoding groups in the sequence, wherein an exponent token represents one or more block exponent values for one or more encoding groups in the sequence; and encoding the plurality of signal samples for storage or transmission, using the exponent tokens and the mantissas to form compressed data.

Another object of the present invention is to provide a method for decompressing an input signal conveying compressed data representing a plurality of encoded original signal samples. The method comprises:

disassembling the compressed data to obtain a plurality of exponent tokens and a plurality of compressed groups of mantissas, where the plurality of the encoded original signal samples are represented by the exponent tokens and the mantissas;

decoding the plurality of exponent tokens to form a plurality of block exponent values, wherein each block exponent value is associated with one of the plurality of compressed groups;

for each of the compressed groups, determining a number of bits representing each of the mantissas in the compressed group using the associated block exponent value, and mapping the number of bits of each mantissa to a corresponding decompressed sample, to form a group of decompressed samples; and applying said determining and said mapping to the plurality of compressed groups to generate a plurality of decompressed samples.

Another object of the present invention is to provide an apparatus for compressing a plurality of signal samples. The apparatus comprises:

logic for grouping the signal samples into a sequence of encoding groups, to form a sequence of encoding groups;

logic determining a block exponent value for each encoding group;

a mantissa encoder that receives the signal samples in each encoding group and forms a mantissa for each signal sample, wherein each mantissa of a particular encoding group has a number of bits based on the block exponent value for the particular encoding group;

an exponent encoder that encodes the block exponent values for the sequence of encoding groups to produce exponent tokens, wherein an exponent token represents one or more block exponent values for one or more encoding groups; and a bit packer arranging the exponent tokens and the mantissas for the sequence of encoding groups to form compressed data for storage or transmission.

Another object of the present invention is to provide an apparatus for decompressing an input signal conveying compressed data representing a plurality of encoded original signal samples. The apparatus comprises:

a buffer receiving the compressed data, wherein the plurality of encoded original signal samples are represented by a plurality of exponent tokens and a plurality of compressed groups of mantissas;

logic coupled to the buffer for disassembling the compressed data to obtain the plurality of exponent tokens and the plurality of compressed groups of mantissas;

an exponent decoder receiving the plurality of exponent tokens and determining a plurality of block exponent values, wherein each block exponent value is associated with one of the compressed groups of mantissas;

a mantissa decoder receiving each compressed group of mantissas and the associated block exponent value, wherein a number of bits representing each of the mantissas in the compressed group is based on the associated block exponent value, the mantissa decoder mapping the number of bits of each mantissa to a corresponding decompressed sample to form a group of decompressed samples, the mantissa decoder decoding the plurality of compressed groups to produce a plurality of decompressed samples.

BRIEF DESCRIPTION OF THE DRAWINGS

FIG. 4 is a table of an encoding scheme that uses four or eight bits for an exponent token.

FIG. 6 gives an example of encoding the exponents of eight blocks of signal samples to form a single compressed packet.

FIG. 9 is a table of exemplary values of n_exp, n_LSB and m_exp.

DETAILED DESCRIPTION

Figure 1:
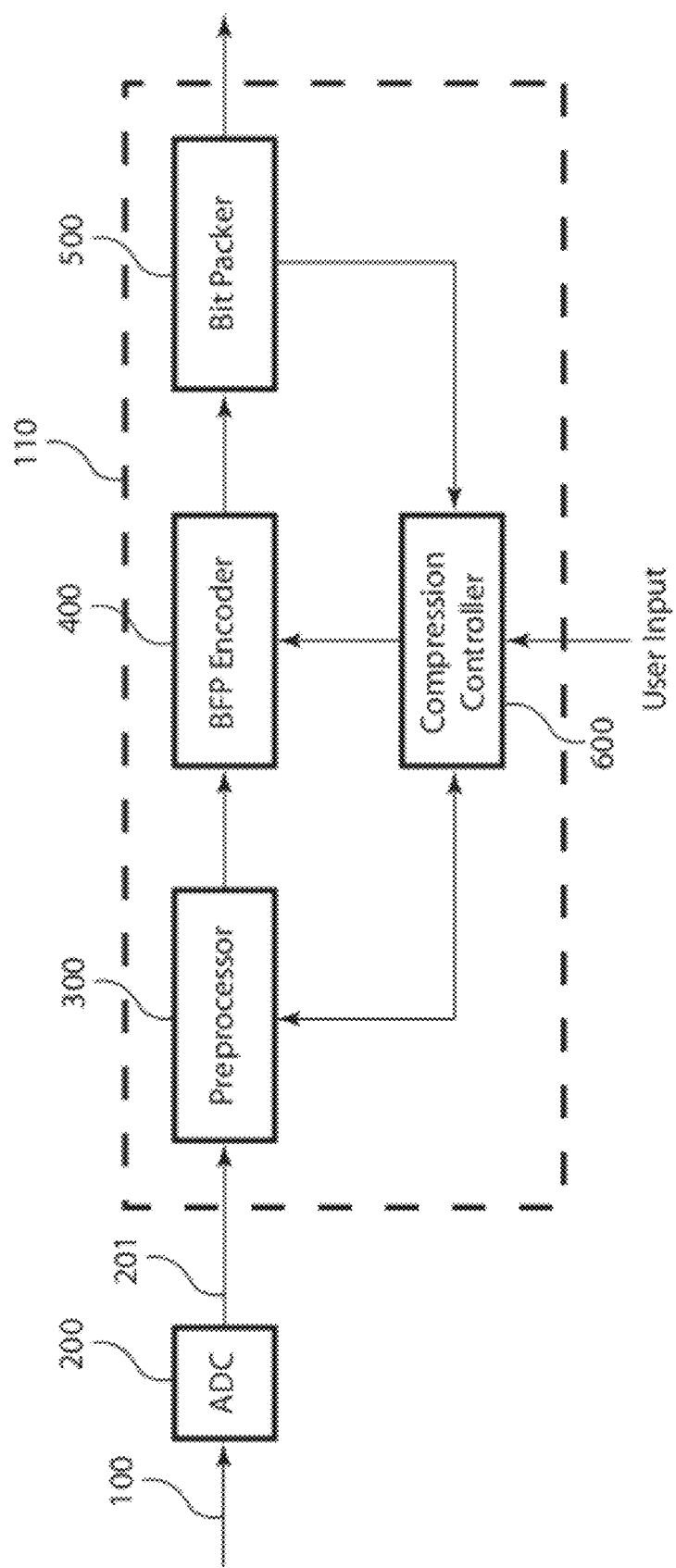
FIG. 1 is a block diagram of a signal processing system that compresses signal samples using block floating point encoding.

FIG. 1 is a block diagram of a signal processing system that compresses signal samples using block floating point encoding. The analog to digital converter (ADC) 200 converts an input analog signal 100 to a sampled signal 201 at a sample rate and number of bits per sample. The compressor 110 is applied to the sampled signal 201 to produce compressed samples. An optional preprocessor 300 may perform various operations on the sampled signal 201 for the particular application or to increase compression performance. The optional preprocessor 300 may provide operations such as signal conditioning, filtering, temporal or spatial windowing and scaling. To increase compression performance in some applications, the preprocessor 300 may include a derivative operator, as described in the '100 patent. Derivatives decrease the magnitude of the samples as long as the signal is at or near baseband (DC). Derivatives actually increase the magnitude of samples when the signal's center frequency is above one-sixth of the sample rate. The block floating point (BFP) encoder 400 defines groups, or blocks, of signal samples, determines an exponent and encodes the mantissas for each group to form a compressed group, as described further below. The bit packer 500 forms compressed packets from a sequence of compressed groups. The bit packer provides information on the sizes of compressed blocks or compressed packets to the compression controller 600. The compression controller 600 adjusts parameters of the BFP encoder 400 to increase or decrease compression to meet desired output data rate or quality metrics. The user may input compression control parameters for the BFP encoder to the compression controller 600. The user input may provide the desired output data rate or quality metrics to the compression controller 600. In addition, the compression controller 600 may provide control parameters to the preprocessor 300.

Figure 2:
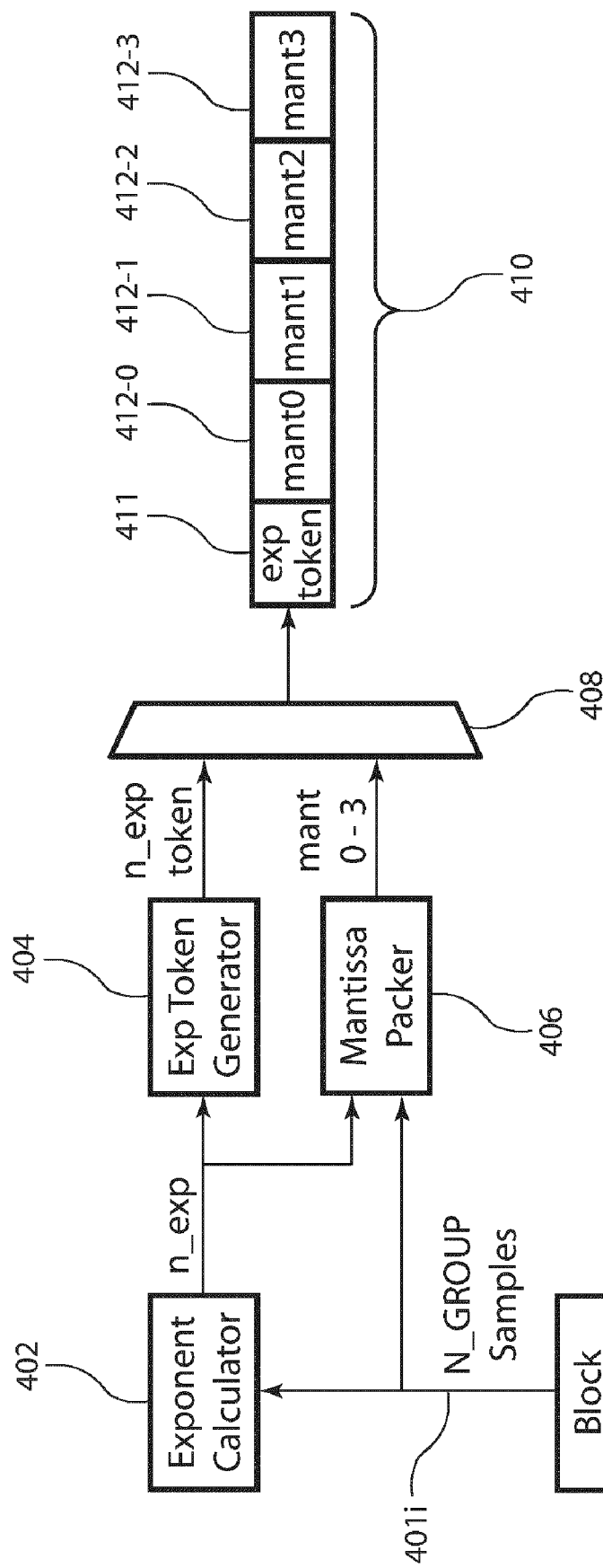
FIG. 2 is a block diagram of the block floating point encoder.

FIG. 2 is a block diagram of an embodiment of the block floating point encoder 400. The block generator 405 defines blocks of N_GROUP samples 401i to be encoded together. For the N_GROUP samples 401i, the maximum exponent is encoded and the N_GROUP mantissas are encoded according to the following steps.

For the first group of N_GROUP samples 401i:
1) Determine the exponent (base 2) for the sample with the maximum magnitude, such as by calculating the $\log_2$ of the maximum magnitude in each group of N_GROUP samples. This indicates the number of bits per encoded sample, or n_exp(0).

2) Absolute encode the exponent n_exp(0) of the first group using S bits, where S is the original number of bits per sample.
3) Encode the N_GROUP samples using n_exp(0) bits per sample.

For the $i^{th}$ group (i>0) of N_GROUP samples 401i:
4) Determine the $i^{th}$ exponent (base 2) for the sample with the maximum magnitude, which indicates the number of bits per encoded sample in the $i^{th}$ group, or n_exp(i);
5) Differentially encode the $i^{th}$ exponent by subtracting n_exp(i) from n_exp (i−1) to determine an $i^{th}$ difference value. Encode the $i^{th}$ difference value using a corresponding token, where shorter tokens represent more common difference values and longer tokens represent less common difference values.
6) Encode the $i^{th}$ group of N_GROUP samples using n_exp (i) bits per sample.

For the first group of samples, the exponent n_exp(0) is directly encoded. For example, the exponent n_exp(0) can be encoded as follows, where S is the original number of bits per sample:
 a. 0: n_exp(0)=0 (all 4 sample values are zero)
 b. 1: n_exp(0)=2 (2 bits per sample)
 c. 2: n_exp(0)=3 (3 bits per sample)
 d. etc. until S−1: n_exp(0)=S (S bits per sample)

For the $i^{th}$ group, the exponent n_exp(i) may be differentially encoded using a prefix code, where no codeword is the prefix of another codeword. An example of differential encoding is as follows:
 1. Calculate difference: e_diff=n_exp(i)−n_exp(i−1)
 2. Encode e_diff as follows:
  a. 0: e_diff=e(i)−e(i−1)
  b. 101: e_diff=+1
  c. 110: e_diff=−1
  d. 1001: e_diff=+2
  e. 1110: e_diff=−2
  f. Etc.

Huffman encoding of the exponent differences assigns tokens of different lengths to the exponent differences based on their frequencies of occurrence. Shorter Huffman tokens may be assigned to the more frequent values of exponent differences. The exponents n_exp(i) may be directly encoded, for example by Huffman encoding, instead of differentially encoded. Alternatives for encoding the block exponents are described below.

Figure 3A:
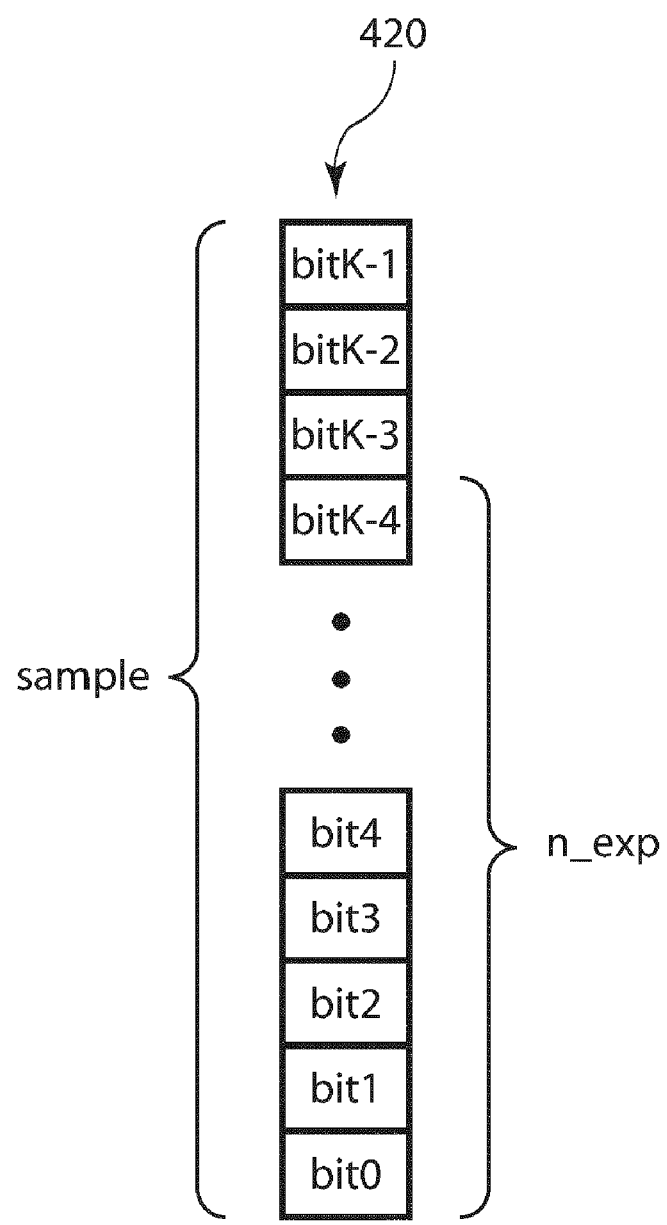
FIG. 3a illustrates an example of selecting n_exp bits for the encoded mantissa.
Figure 3B:
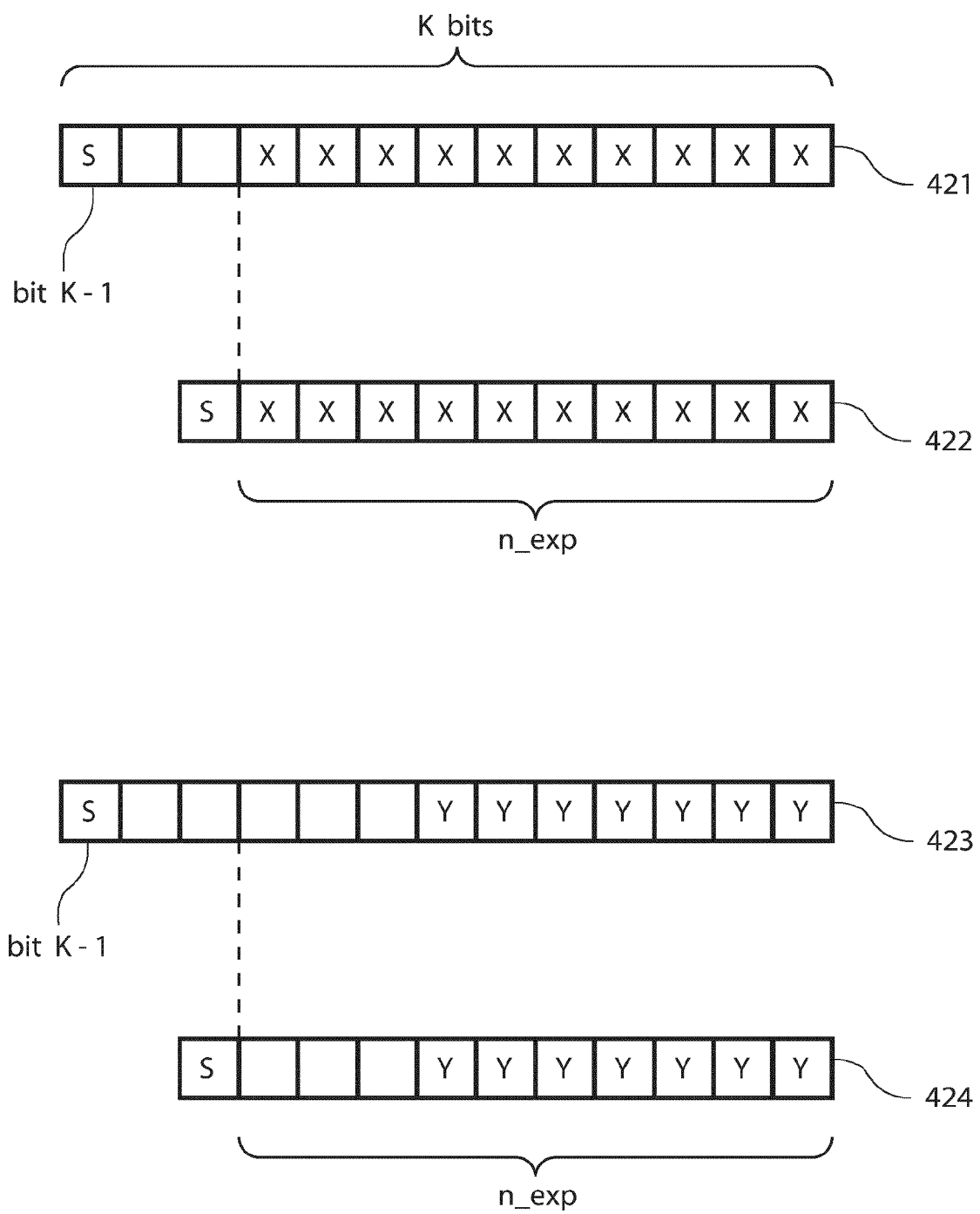
FIG. 3b shows an example of compressing two samples within the same block.

FIG. 2 is an example of the block floating point encoder 400 where N_GROUP=4 samples. The exponent calculator 402 determines the maximum exponent, n_exp, for the N_GROUP samples as in step 1 and step 4. The maximum exponent corresponds to the log base 2 of the sample with the maximum magnitude. The exponent token generator 404 encodes the n_exp values as in step 2 and step 5. The mantissa packer 406 encodes the mantissas for the N_GROUP samples as in step 3 and step 6, producing mantissas having n_exp bits. FIG. 3a illustrates an example of selecting n_exp bits for the encoded mantissa. The input sample 420 is represented by K bits. The n_exp lower bits of the sample 420 are selected for encoding. The sign bit for the sample is appended to the selected bits and the resulting sequence of bits represents the encoded sample. FIG. 3b shows an example of compressing two samples within the same block. For this example, the samples are represented in a sign-magnitude format. The maximum magnitude sample 421 of the N_GROUP samples in the block occupies n_exp mantissa bits, indicated by "X". The original number of bits per sample is K, indexed from 0 to K−1 with bit K−1 representing the sign bit "S". The compressed sample 422 represents the n_exp mantissa bits "X", in accordance with steps 3 and 6, along with the sign bit "S". Sample 423 represents another sample in the block of N_GROUP samples occupying the bits indicated by "Y". The compressed sample 424 uses n_exp bits to represent the mantissa bits "Y", in accordance with steps 3 and 6, along with its sign bit "S". The mantissas of the compressed samples 422 and 424 have the same integer values as the corresponding mantissas of the uncompressed samples 421 and 423, however the bit width of each mantissa is reduced. Returning to FIG. 2, the multiplexer 408 packs the encoded exponent token 411 followed by the set of N_GROUP encoded mantissas along with the sign bits to form the compressed group 410 representing the N_GROUP compressed samples. For this example, the compressed group 410 includes the exponent token 411 followed by the sequence of four packed mantissas (with appended sign bits) 412-0, 412-1, 412-2 and 412-3. The bit packer 500 may concatenate consecutive compressed groups 410 to form the data portion of a compressed packet. Alternatively, the bit packer 500 may arrange a sequence of exponent tokens corresponding to a sequence of groups followed by the corresponding sets of mantissas. The preferred sizes for N_GROUP are three or four samples per group. However, variable group sizes may also be used.

Encoding the mantissas and exponents separately can provide additional compression and mitigate compression error. In a preferred embodiment for exponent encoding, two or more exponent difference values are jointly encoded. A statistical analysis of block exponent values for signal data from various applications, including ultrasound, radar and computed tomography raw data showed that 90% of consecutive exponents have differences in the range of {−1, 0, +1} and that 98% of consecutive exponents have differences in the range {−2, −1, 0, +1, and +2}. Jointly encoding two or more successive exponent differences can reduce the number of bits per encoded exponent. An encoding scheme that uses four or eight bits for an exponent token is given in FIG. 4. By using a fixed number of exponent bits, the complexity of both compression and decompression is reduced, when compared to exponent encodings that permit exponent tokens having arbitrary bit lengths. FIG. 4's table lists exponent token values for three encoding options: (A) jointly encoding two successive exponent differences, (B) encoding one exponent difference and (C) absolute (or linear) encoding of one exponent value. The successive exponent differences {diff(i), diff (i−1)} for the joint encoding option (A), given in the third column, have nine different combinations of difference values, in which both the first and the second encoded exponent difference have one of three possible values {−1, 0, +1}. These nine of sixteen combinations in the table may be encoded using exponent tokens having 4 bits each. Since one token encodes the exponents for two blocks, the joint encoding of exponent differences uses 2 bits per block exponent. Encoding of a single exponent difference in the range {−2, −1, 0, +1, +2} and the associated exponent tokens are listed for option (B). This option uses five of the sixteen combinations in the table. Finally, absolute encoding for the exponent value itself, n_exp(i), listed for option (C), uses 8 bits per exponent token. In this embodiment, the top three bits are set to 1's and the bottom five bits encode the exponent. The top three bits set to 1's indicate that the exponent is absolute encoded. The five lower bits indicate one absolute exponent in the range {0, 2, 3, . . . , 32}, where an exponent value of 1 is not allowed. Using an integer number of nibbles (4-bit units) simplifies exponent encoding and later decoding. Applying the exponent encoding of FIG. 4 to the signal data from the above applications showed the following proportions for the exponent encoding options:

(A) joint encoding option (2 bits/exponent)–80% of the exponents (B) differential encoding option (4 bits/exponent)–18% of the exponents (C) linear encoding option (8 bits/exponent)–2% of the exponents The weighted average of the bits/exponent for each of the options indicates that the average number of bits per encoded exponent is about 2.48 bits. Since there are N_GROUP individual samples per encoded exponent, the exponent encoding scheme provides substantial efficiency when compared to alternative exponent encoding techniques, especially those using one exponent per mantissa.

For efficient encoding and decoding of packets, the compressed data for all the samples represented by the packet are contained within the packet. Absolute encoding the first block exponent of the packet makes the first exponent token independent of the previous packet. The final block exponent of the packet may be differentially encoded with the next-to-last block exponent of the packet. The exponent difference corresponding to the last block exponent and the previous block exponent may be jointly encoded with the previous exponent difference within the same packet, but may not be jointly encoded with the first exponent difference of the subsequent packet.

Figure 5:
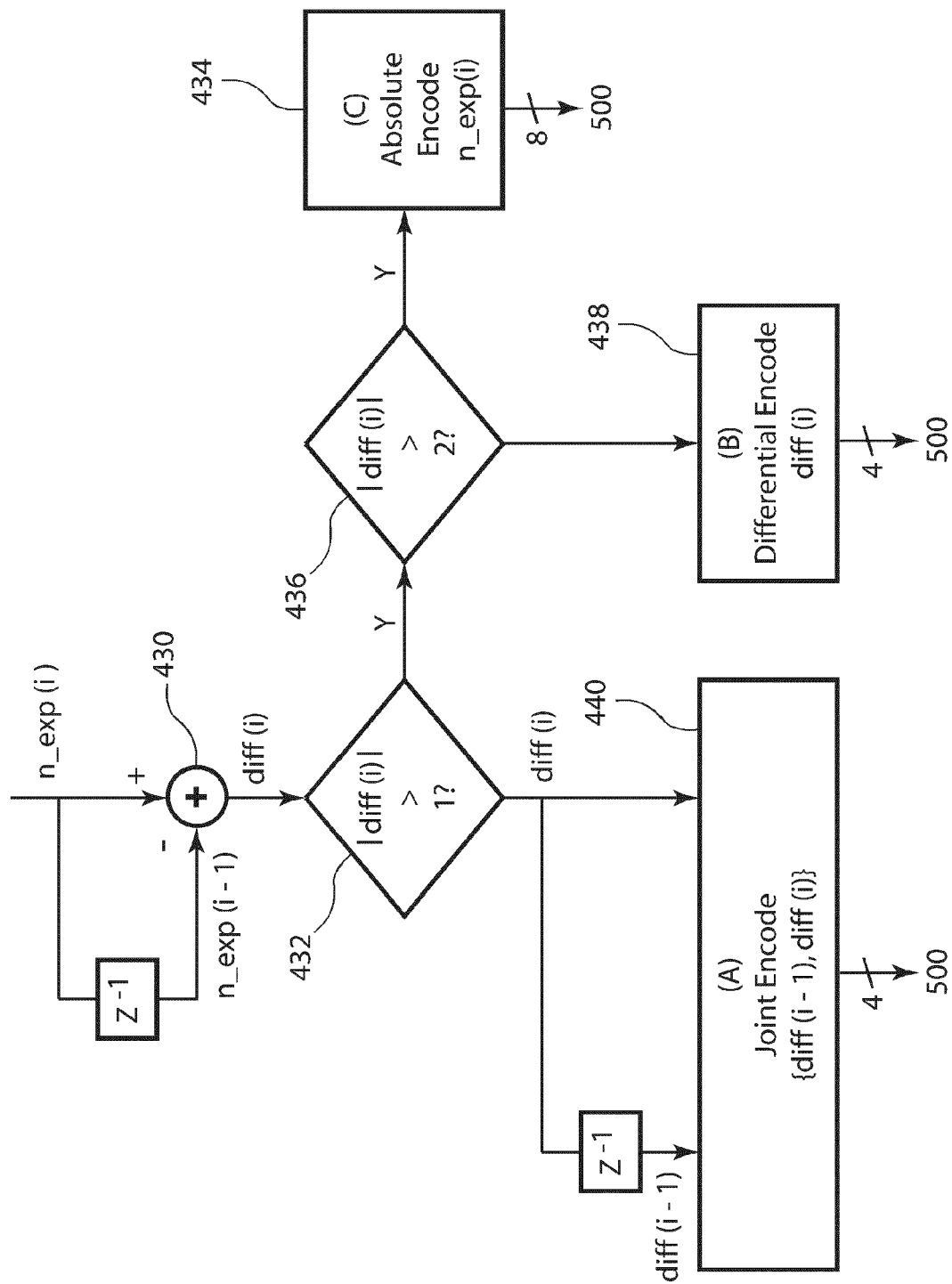
FIG. 5 is a block diagram of exponent encoding for a block of N_GROUP samples.

FIG. 5 is a block diagram of exponent encoding for a block of N_GROUP samples 401i. This block diagram does not include the additional conditions for encoding the first and last block exponents in the packet described above. The subtractor 430 subtracts the block exponent n_exp(i) for the current block from the previous block exponent n_exp(i−1) to form exponent difference diff(i). The decision block 432 tests whether the magnitude of the difference is greater than 1. If both diff(i) and the exponent difference diff(i−1) from the previous iteration are less than or equal to one, then the joint encoder 440 jointly encodes both diff(i) and diff(i−1) as indicated by option (A) in FIG. 4 to form a 4-bit token representing both exponent differences. If diff(i) is greater than 1, then the decision block 436 tests whether the magnitude of the difference is greater than 2. If the magnitude of diff(i) is greater than 2, then the absolute encode block 434 encodes the exponent n_exp(i) as indicated by option (C) in FIG. 4 to form an 8-bit token representing n_exp(i). If not, then the differential encode block 438 encodes diff(i) as indicated by option (B) in FIG. 4 to form a 4-bit token representing the exponent difference diff(i). The exponent token is provided to the bit packer 500.

FIG. 6 gives an example of encoding the exponents of eight blocks of signal samples to form a single compressed packet. In this example, the first two block exponents are absolute encoded (option (C)) to have eight bits per token. The exponent differences of blocks 3 through 6 are jointly encoded (option (A)) to form a 4-bit exponent token for blocks 3 and 4 and a 4-bit exponent token for blocks 5 and 6. The exponent differences for blocks 7 and 8 are each differentially encoded to produce one 4-bit exponent token for each block. While the exponent difference for block 7, diff(7)=+1, falls within the range for joint exponent encoding, the exponent difference for block 8, diff(8)=−2, does not. Therefore, diff(7) and diff(8) are each assigned a 4-bit exponent token, 1100 and 1001, respectively.

Figure 7:
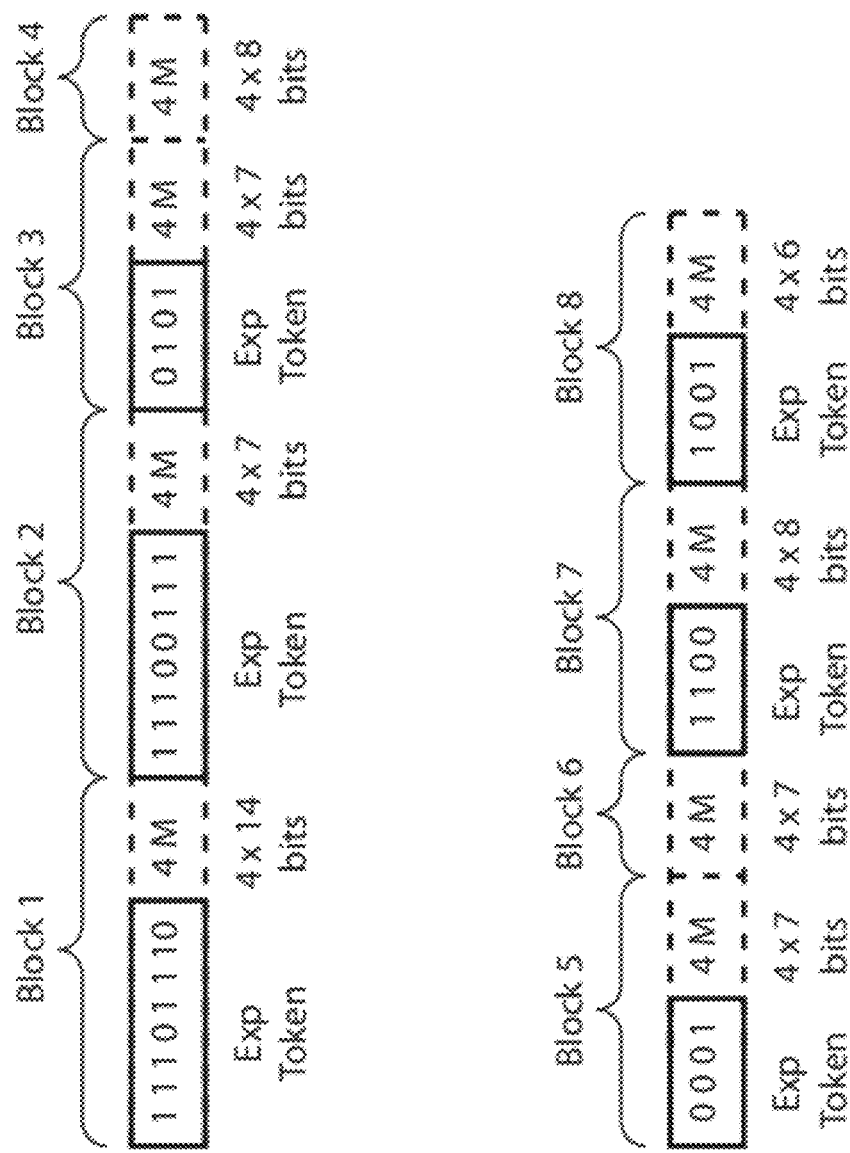
FIG. 7 is a diagram of the data portion of a compressed packet for the compressed blocks of the example of FIG. 6.

FIG. 7 is a diagram of the data portion of a compressed packet for the compressed blocks of the example of FIG. 6. The compressed packet would also include a header, not shown. The packed bits for the four mantissas, including the sign bits, of each block are indicated by "4M" in the diagram and are not shown to scale. The compressed block 1 includes an 8-bit exponent token and the packed bits for four 14-bit mantissas. The compressed block 2 includes an 8-bit exponent token and the packed bits for four 7-bit mantissas. Since the exponent differences for blocks 3 and 4 are jointly encoded, the compressed block 3 includes the 4-bit exponent token and four 7-bit mantissas. The compressed block 4 includes four 8-bit mantissas and no exponent token. Since the exponent differences for blocks 5 and 6 are jointly encoded, the compressed block 5 includes the 4-bit exponent token and four 7-bit mantissas. The compressed block 6 includes four 7-bit mantissas and no exponent token. The compressed block 7 includes the exponent token representing the difference between the exponents corresponding to block 6 and block 7 and four 8-bit mantissas. The compressed block 8 includes the exponent token representing the difference between the exponents corresponding to blocks 7 and 8 and four 6-bit mantissas. For this example, eight blocks are encoded using five exponent tokens.

In an alternative embodiment for exponent encoding, the difference values of consecutive exponents are calculated and encoded. The exponents vary slowly, so there are relatively few nonzero values separated by strings of zero values. The exponent difference values can be efficiently encoded by representing only the nonzero difference values and their corresponding positions. The position can be represented by the corresponding index value or relative to the position of last nonzero difference value. Encoding of the exponent difference values is lossless, which prevents relatively large errors. For decoding the exponents, the exponent values are reconstructed by integrating the exponent difference values and decoding the corresponding position locations. For decoding of the mantissas, each reconstructed mantissa value is restricted so that it does not change the value of the corresponding exponent of the decoded sample. For a decoded exponent of n_exp, the reconstructed mantissa can have a maximum value of $2^{n-exp}-1$. This prevents compression error in the mantissa from changing the value of the exponent.

Figure 8A:
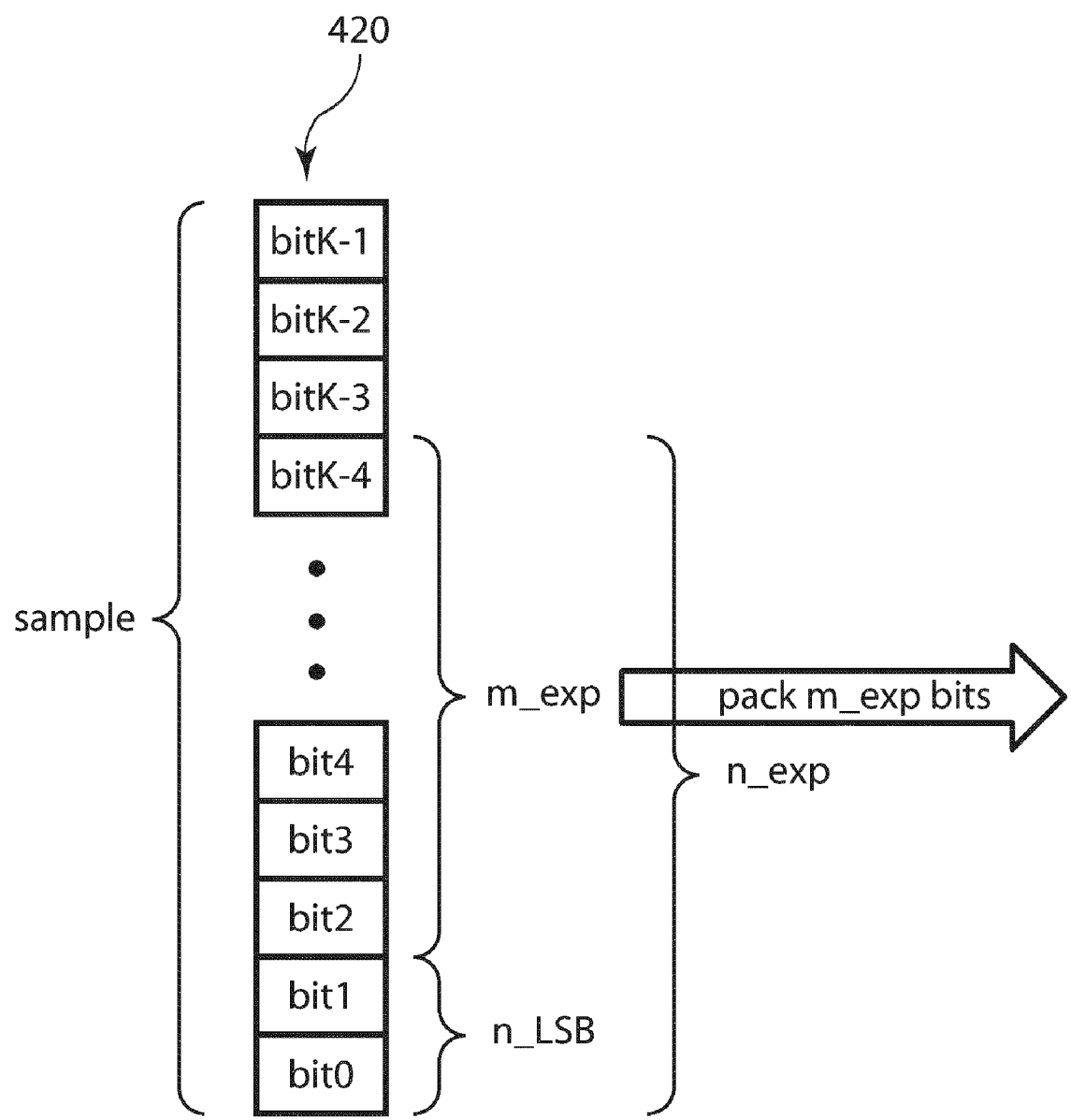
FIG. 8a illustrates bit selection including removing LSBs for the reduced mantissa.
Figure 8B:
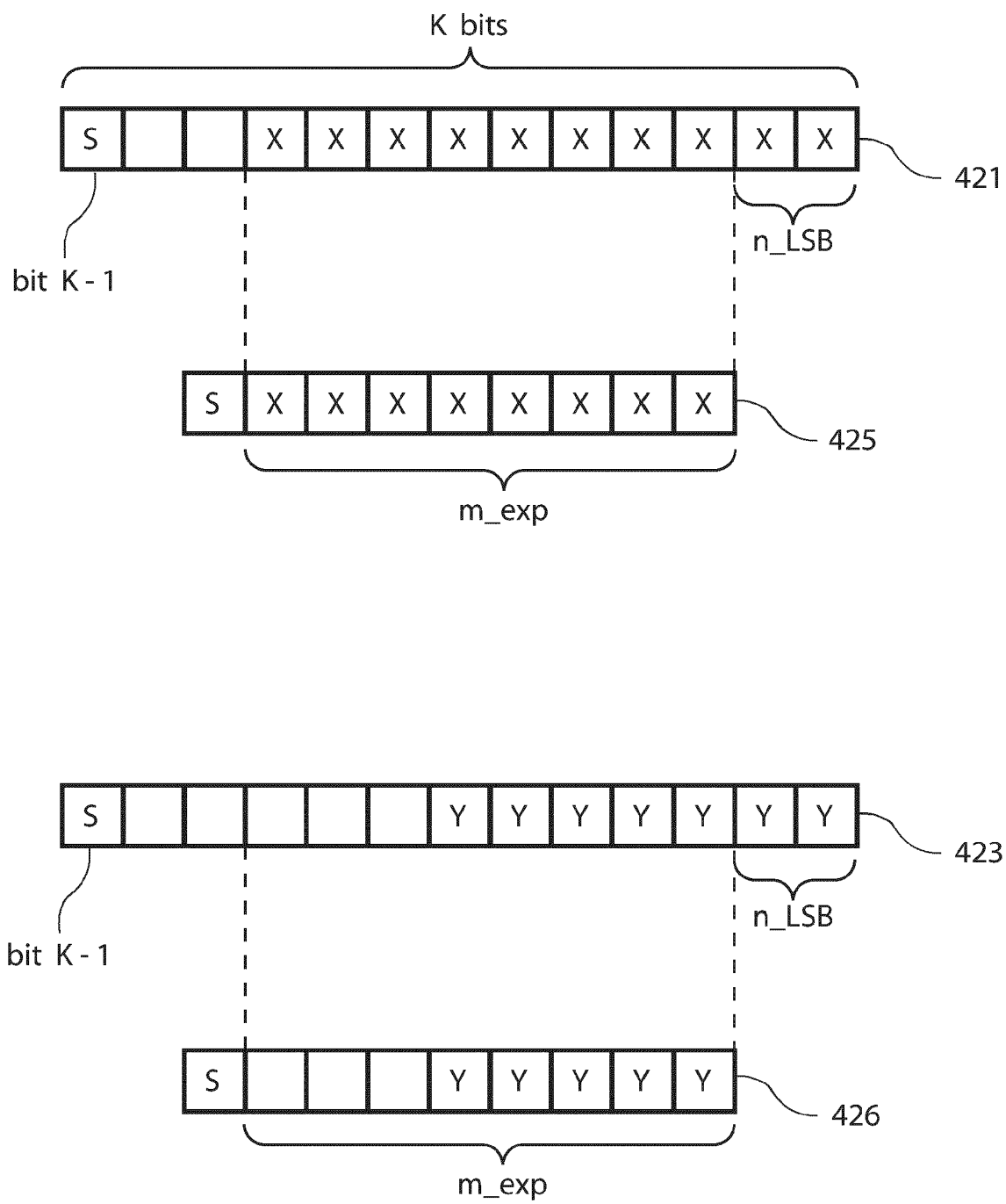
FIG. 8b shows an example compressing two samples within the same block where the reduced mantissas have m_exp bits.

Another alternative block floating point encoding method provides further reduction in the number of bits representing the mantissa along with the differential encoding of the exponents described above. The number of bits representing the mantissas of the N_GROUP samples is further reduced by selectively removing a number of least significant bits (LSBs), or n_LSB, from each mantissa. The value of n_LSB depends on the value of n_exp for the block of samples, as described below. FIG. 8a illustrates bit selection including removing LSBs for the reduced mantissa. The n_exp is determined as in step 1 and step 4 above. Instead of encoding all of the n_exp lower bits of the mantissa, a number n_LSB of bits, starting with the least significant bit, are removed. The remaining m_exp bits (m_exp=n_exp−n_LSB) are selected for encoding. FIG. 8b shows an example compressing two samples within the same block where the reduced mantissas have m_exp bits. This example uses the same input samples 421 and 423 as the example described with respect to FIG. 3b. The maximum magnitude sample 421 of the N_GROUP samples in the block occupies n_exp bits, indicated by "X". With the n_LSB bits removed, the compressed sample 425 represents the m_exp bits "X" in the reduced mantissa having fewer MSBs and LSBs. Sample 423 represents another sample in the block of N_GROUP samples represented by the bits "Y". With the n_LSB samples removed, the compressed sample 426 uses m_exp bits to represent the bits "Y" in the reduced mantissa having m_exp bits. The mantissas of the compressed samples 425 and 426 have different integer values from the corresponding mantissas of the uncompressed samples 421 and 423. When the n_LSBs are removed through rounding, the integer values of the reduced mantissas of the compressed samples 425 and 426 may be higher or lower than the respective uncompressed samples 421 and 423. When the n_LSBs are removed through truncation, the integer values of the reduced mantissas of the compressed samples 425 and 426 may be lower than the respective uncompressed samples 421 and 423.

The value of n_LSB depends on the value of n_exp in accordance with a formula or a table. FIG. 9 is a table of exemplary values of n_exp, n_LSB and m_exp. For larger values of n_exp, more LSBs are removed by truncating or rounding to form the reduced mantissa having m_exp bits. For example, if n_exp is 12, 3 LSBs are removed so that 9 mantissa bits are retained for packing the N_GROUP reduced mantissas. The block floating point encoder 400 can store a lookup table of values of n_exp, n_LSB and m_exp. Alternatively, the block floating point encoder 400 can represent n_LSB and m_exp as a function of n_exp and calculate their values when needed.

Figure 10:
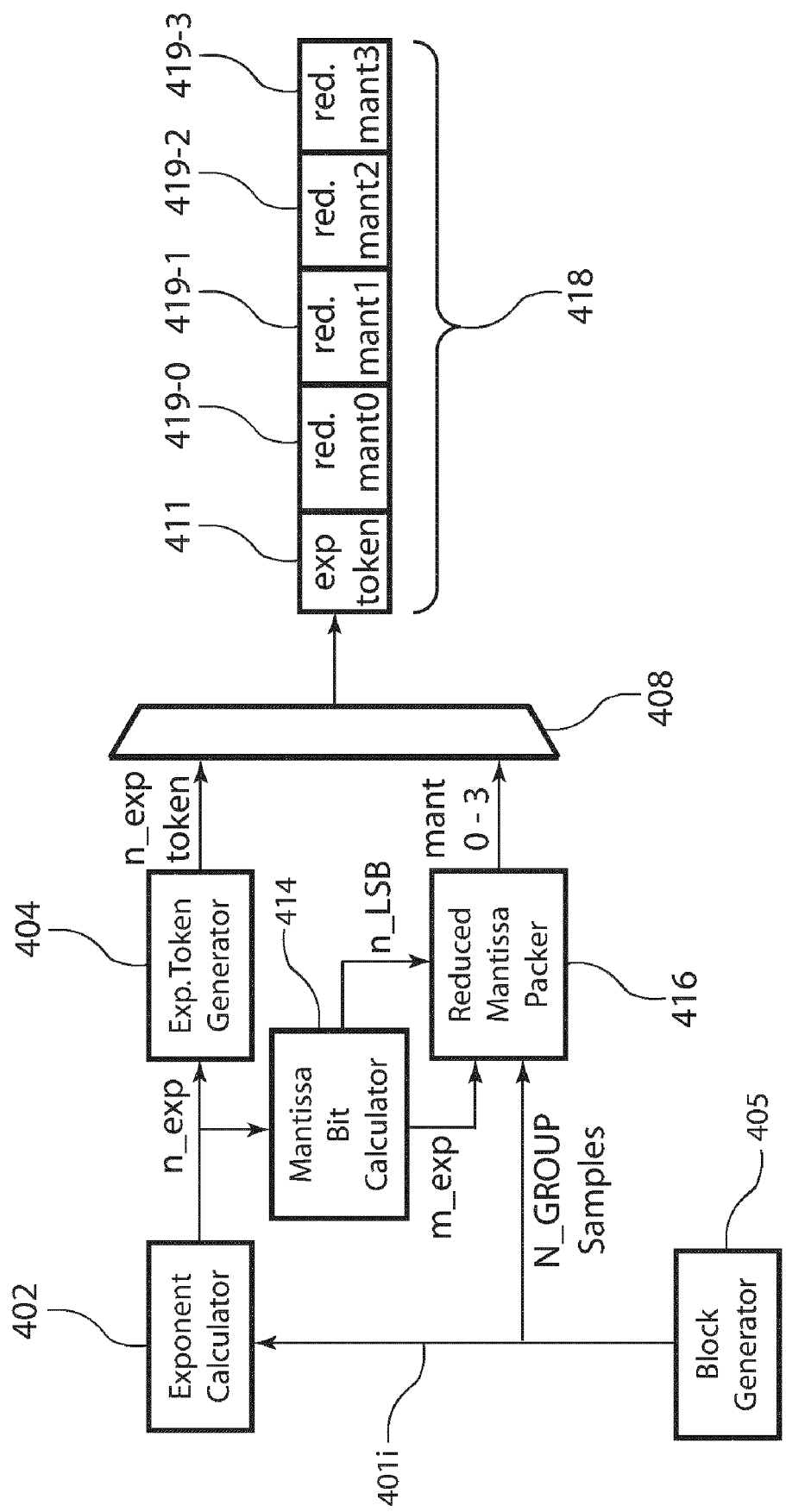
FIG. 10 is a block diagram of the block floating point encoder that includes removing LSBs.

FIG. 10 is a block diagram of the block floating point encoder 400 that includes removing LSBs. For the each group of N_GROUP samples, the exponent calculator 402 determines the maximum exponent n_exp as described above. The mantissa bit calculator 414 determines the number of bits m_exp in the reduced mantissa using a lookup table or formula relating n_LSB, m_exp and n_exp, referred to herein as a quantization profile. The reduced mantissa packer 416 selects the m_exp bits for each of the N_GROUP samples. The multiplexer 408 then packs the exponent token 411 followed by the reduced mantissas (along with the appended sign bits) 419-0, 419-1, 419-2 and 419-3 to form the compressed group 418. For some conditions, no LSBs are removed from the group of N_GROUP samples. For example, when the magnitude of one or more samples in the N_GROUP samples is less than an acceptable minimum, the N_GROUP mantissas including the original LSBs will be packed. The bit packer 500 may concatenate consecutive compressed groups 418 to form the data portion of a compressed packet. Alternatively, the bit packer 500 may arrange a sequence of exponent tokens corresponding to a sequence of groups followed by the corresponding sets of mantissas. Note that n_exp, not m_exp, is used as the input to exponent token generator 404. Both the compressor 110 and the decompressor 700 use the same quantization profile (such as the example table in FIG. 9) that relates n_exp, n_LSB, and m_exp. A preferred embodiment includes a table selector value in the header of each compressed packet, thus allowing the currently active quantization profile to change from packet to packet.

The compression controller 600 provides compression control parameters to the block floating point encoder 400. The compression control parameters may include the alternative quantization profiles represented by lookup tables or formulas relating n_LSB, m_exp and n_exp. The compression control parameters may include the block size parameter N_GROUP and selection parameters for the quantization profiles. The compression controller 600 can respond to user input to select the compression control parameters. The user may select compression control parameters that provide a fixed bit rate of compressed data or a fixed quality metric, or level of distortion, of the compressed data.

The quantization profile relating n_LSB and m_exp to n_exp can be represented by a function, as follows, $$(n\_LSB, m\_exp) = f(n\_exp) \qquad (1)$$

Figure 11A:
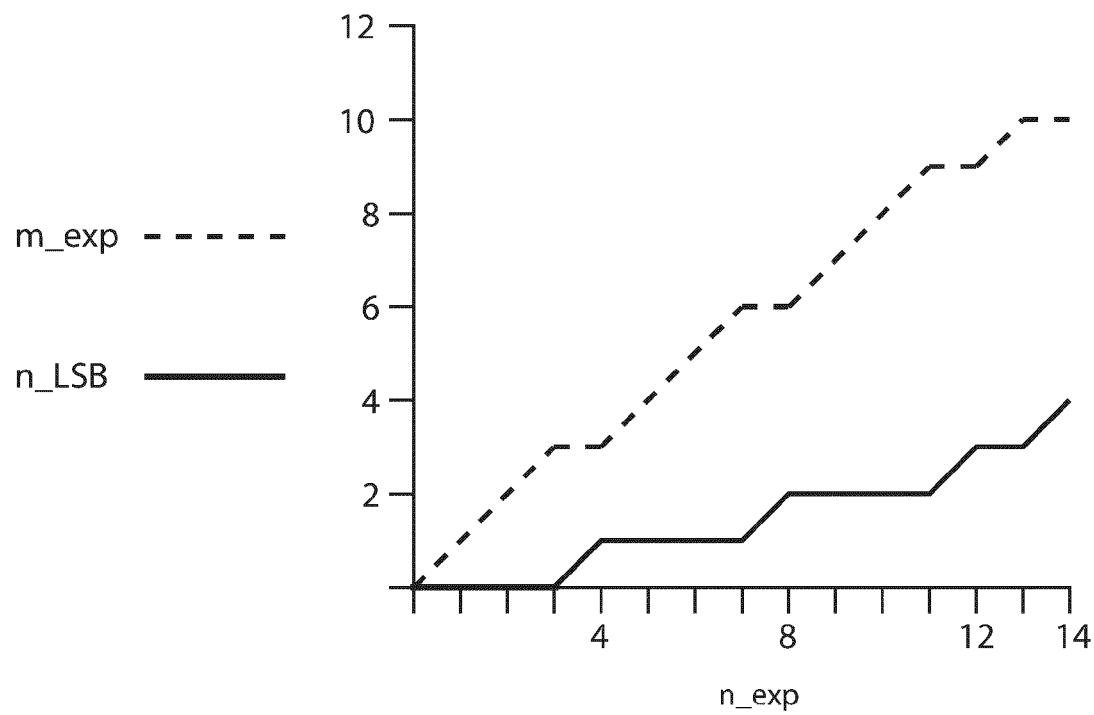
FIG. 11a is a graph corresponding to the table given in FIG. 9 representing an example of a quantization profile function f(n_exp).
Figure 11B:
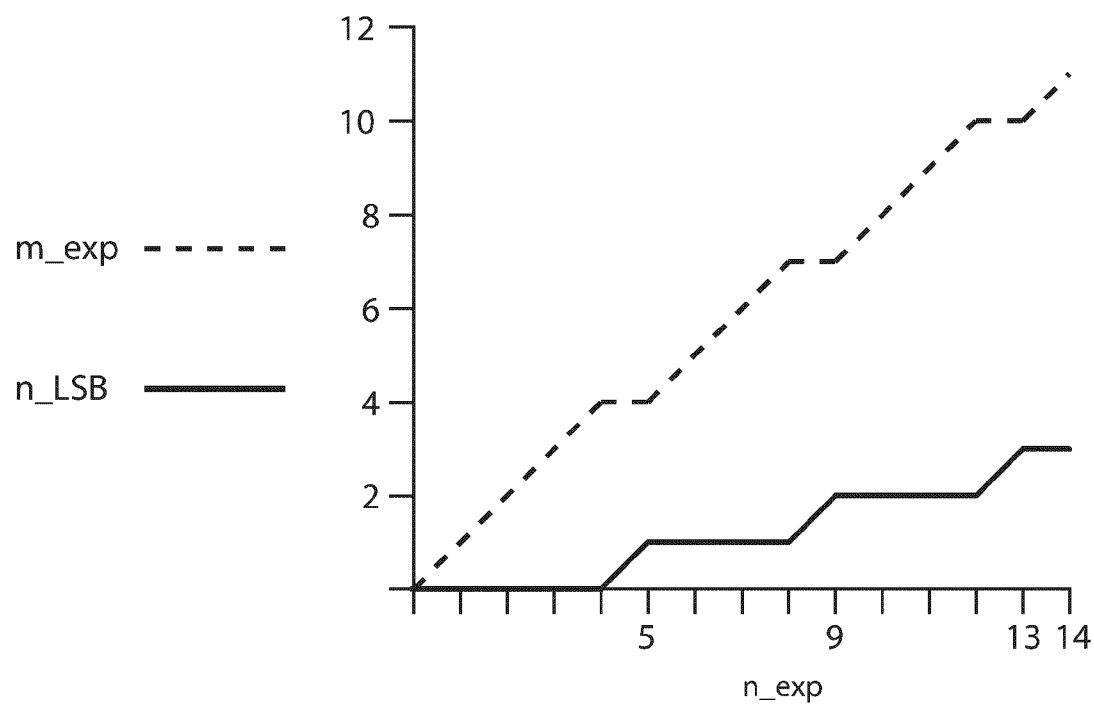
FIG. 11b is another example of a graphical representation of a quantization profile function f(n_exp).
Figure 11C:
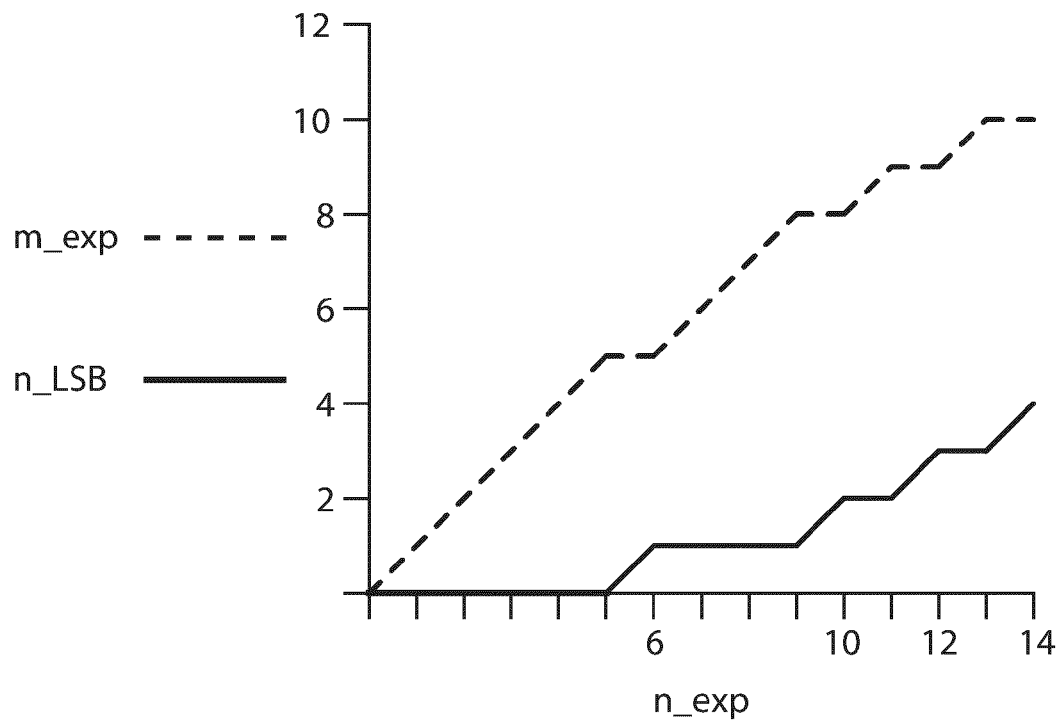
FIG. 11c is another example of a graphical representation of a quantization profile function f(n_exp).
Figure 11D:
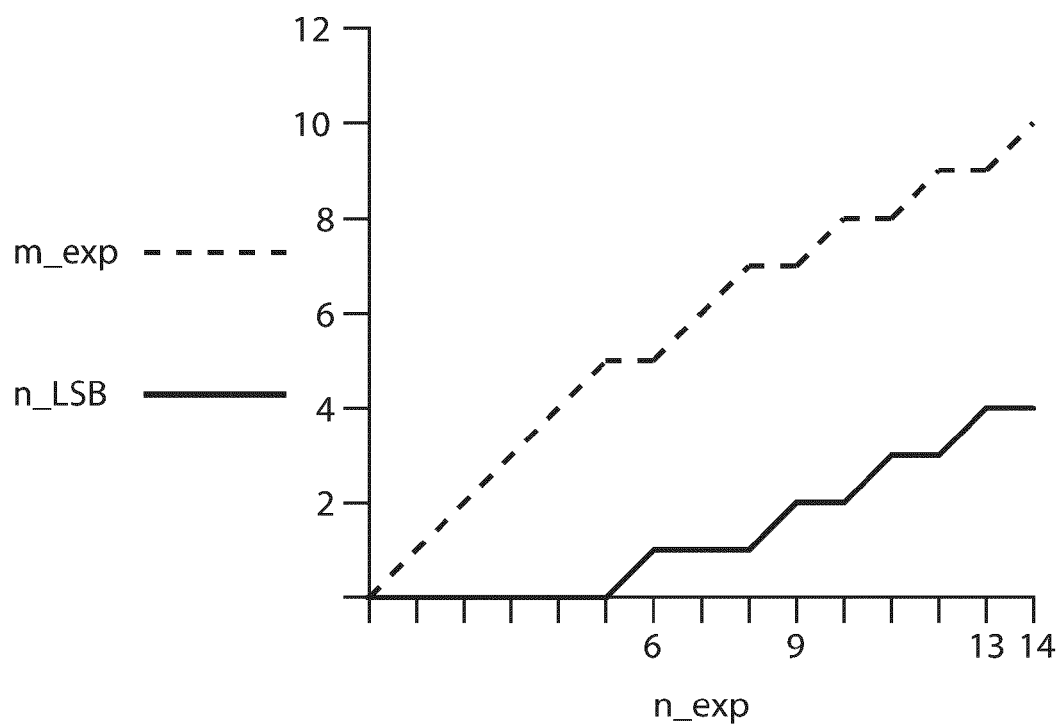
FIG. 11d is another example of a graphical representation of a quantization profile function f(n_exp).

FIGS. 11a through 11d are graphical representations of exemplary functions f(n_exp). The solid lines indicate the values of n_LSB and the dashed lines indicate the values of m_exp. FIG. 11a is a graphical representation of the table given in FIG. 9. FIGS. 11b, 11c and 11d give other examples. The quantization profiles may be designed to minimize error of the compressed samples for defined ranges of n_exp. A particular quantization profile applied to the samples results in compressed samples having a corresponding bit rate and error level.

For a fixed quality of the compressed data, compression controller 600 may select the quantization profile that provides a particular signal quality metric or level of distortion. The quality metric can be based on error in the compressed samples due to the truncation or rounding of the reduced mantissas. For the block floating point representations using reduced mantissas, these errors can be calculated using the probability of occurrence, or probability density function (PDF), of the exponent values in the samples. Referring to FIG. 9, the number of LSBs, n_LSB, removed from the mantissas in the block depends on the maximum exponent value for the block, n_exp. The removed LSBs from the mantissas are the source of the rounding or truncation errors. The PDF of the signal data may be modeled using Gaussian or Poisson density functions. For this approach, parameters of the PDF, such as the mean, variance or standard deviation, may be calculated using conventional statistical techniques.

Alternatively, the PDF itself may be estimated by calculating a histogram of exponent values for the samples. The histogram may be calculated using conventional statistical techniques that determine the number of samples having each of the possible exponent values. The samples used for the statistical calculations may correspond to samples output from the preprocessor 300 applied to actual data or simulated data for the particular signal type.

The truncation or rounding error in a reduced mantissa is referred to herein as quantization error, or QE. The quantization error for the $j^{th}$ sample s(j) is calculated by, $$QE(j) = s(j) - Q[s(j)] \qquad (2)$$

where Q[s(j)] is the quantized value of s(j) resulting from rounding or truncating s(j) to the m_exp bits. This error calculation is applicable when decompression appends n_LSB zeros to the quantized mantissa to produce a decompressed sample with the original number of bits. Since m_exp depends on n_exp for the block containing the $j^{th}$ sample, the quantization error QE(j) also depends on n_exp.

The quantization error QE(n_exp) as a function of exponent values n_exp may be estimated based on the quantization profile f(n_exp). Alternatively, the quantization error may be measured by applying the quantization profile to test signals having multiple test samples and calculating the QE(j) using equation (2). The average of QE(j) for the multiple test samples can represent an expected error corresponding to the particular quantization profile.

Alternatively, the expected error may be calculated based on the PDF of the signal. The expected error E based on the PDF is given by, $$E = \Sigma QE(exp) PDF(exp) \qquad (3)$$

where PDF(exp) is the probability density function of the exponent values exp. The summation operation Σ sums over the exponent values, exp, from the minimum to maximum n_exp such that n_LSB≠0, i.e. QE(n_exp)≠0. For example, referring to FIG. 9, the minimum n_exp is 4 and the maximum n_exp is 14. The quantization error for a reduced mantissa as a function of n_exp is given by, $$QE(n\_exp) = mantissa(n\_exp) - mantissa(m\_exp) \qquad (4)$$

The mantissa(n_exp) represents the full precision mantissa and mantissa(m_exp) represents the reduced mantissa having m_exp bits, where m_exp=n_exp−n_LSB, in accordance with the quantization function f(n_exp). The expected error can then be calculated using equation (3). When the user selects the desired quality, the corresponding quantization formula, the compression controller 600 will select the corresponding quantization profile f(n_exp) represented by a table or a formula.

For a fixed bit rate or compression ratio of the compressed data, the compression controller 600 may select the quantization profile that provides the desired bit rate with minimal distortion of compressed data. The bit rate associated with a particular quantization profile may be estimated based on the PDF(exp). Since the quantization profile indicates the number of bits m_exp for encoding the mantissa as a function of n_exp, in accordance with equation (1), the number of bits for encoding the mantissas of N_SAMP samples is estimated as follows:

$$N\_MANT\_BITS = N\_SAMP * \Sigma m\_exp(exp)PDF(exp) \quad (5)$$

where PDF(exp) is the probability density function of the exponent values and m_exp(exp) indicates the number of bits per mantissa m_exp associated with the particular n_exp in accordance with the quantization profile. The summation operation Σ sums over the exponent values from the minimum to maximum n_exp, as described above with respect to equation (3). The number of bits for encoding the block exponents N_EXP_BITS as described above with respect to FIG. 4 is estimated as follows:

$$N\_EXP\_BITS = 2.48 * N\_SAMP/N\_GROUP \quad (6)$$

The empirical factor 2.48 is the average number of bits per encoded exponent determined by applying the exponent encoding of FIG. 4 to signal data from various applications described above. This factor may be measured for other applications by applying the exponent encoding described above to signal data for the application of interest. Since one exponent is encoded per N_GROUP samples, the number N_EXP_BITS is usually small relative to N_MANT_BITS. The number of compressed data bits N_COMP_BITS for the N_SAMP samples is the sum, $$N\_COMP\_BITS = N\_MANT\_BITS + N\_EXP\_BITS \quad (7)$$

The compression ratio CR is given by, $$CR = BITS\_SAMPLE * N\_SAMP/N\_COMP\_BITS \quad (8)$$

where BITS_SAMPLE is the number of bits per sample input to the BFP encoder 400.

The above approximations for error and compressed bit rate do not model the effect of block exponents where there may be different exponent values EXP within a given block of N_GROUP samples where the maximum exponent is n_exp. The previous results based on empirical measurements showing that the block exponents, or n_exp, vary slowly from block to block indicates that the above approximations are useful. Alternative block exponent models may incorporate conditional probabilities P(EXP/n_exp) for the exponent values within a block having the maximum exponent value of n_exp.

For fixed bit rate or fixed quality, a set of quantization profiles along with corresponding quality metrics (based on error, distortion level, signal to noise ratio, etc.) and corresponding bit rates for each quantization profile is provided to the compression controller 600. The quantization profiles and corresponding quality metrics can be determined for a particular application using signal models and/or applying the BFP encoding to actual or simulated signal data and measuring the results. One or more sets of quantization profiles can be determined during system calibration using test signals, for example. The set(s) of quantization profiles may be downloaded to a memory of the compression controller 600. The user may select the particular set quantization profiles for use during compression of signal samples. The compression controller 600 can adaptively select a series of quantization profiles from the set that varies from packet to packet.

Figure 12:
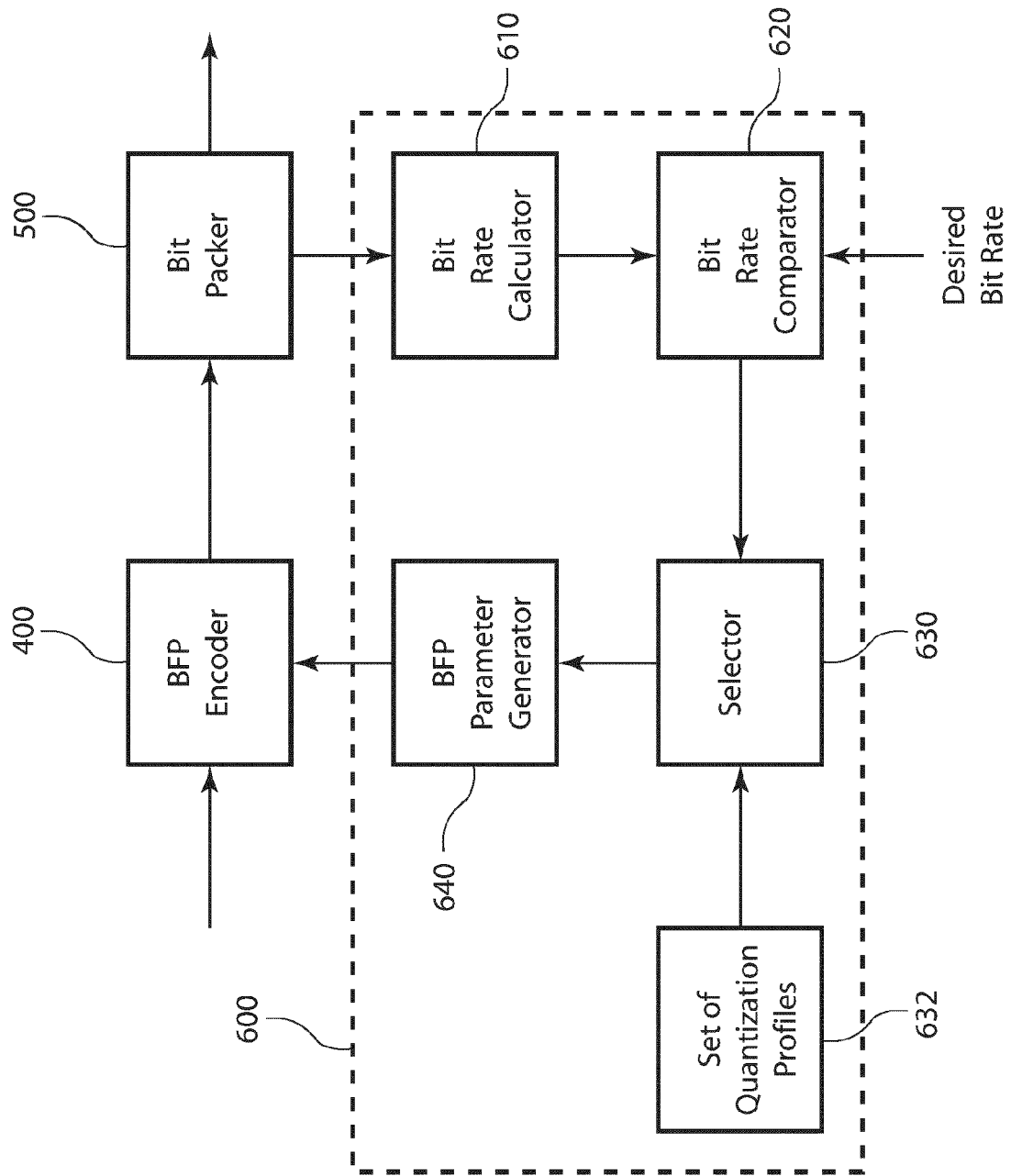
FIG. 12 is a block diagram of feedback control to the BFP encoder for a fixed bit rate of the compressed data.

The compression controller 600 may provide feedback control to the BFP encoder 400 and, optionally to the preprocessor 300. FIG. 12 is a block diagram of feedback control to the BFP encoder 400 for a fixed bit rate of the compressed data. The compression controller 600 receives bit rate information from the bit packer 500, such as the bit count per packet of compressed samples. The bit rate calculator 610 computes a bit rate or packet size of the compressed packets for the purpose of feedback control. The bit rate calculator 610 may average the bit counts over several compressed packets to compute the bit rate. The comparator 620 determines whether the measured bit rate is within a tolerance range of the desired bit rate. If the measured bit rate is outside the tolerance range, the selector 630 selects a new quantization profile from the set of quantization profiles 632 to provide a lower or higher bit rate. The tolerance range may be defined by the user. The comparator 620 may calculate a difference between the measured bit rate and the desired bit rate. The tolerance range for the difference may be zero or may fall within a range of difference values. The tolerance range may include positive and negative endpoints so that the compressed bit rate can be adjusted when it is too high or too low. The compression controller 600 may include a memory for storing the set of quantization profiles 632. The BFP parameter generator 640 provides the corresponding compression control parameters relating n_exp to n_LSB and m_exp to the BFP encoder 400 for the mantissa bit calculator 414 (see FIG. 10). In an embodiment where the quantization profile is represented by a formula stored in the memory, the BFP parameter generator 640 calculates entries for a look-up table (LUT) relating n_exp to n_LSB and m_exp. In an embodiment where the quantization profile is represented as a LUT, the BFP parameter generator 640 provides a compression control parameter indicating the selected LUT. In an alternative embodiment, the BFP encoder 400 may store the quantization profiles (formulas or tables) in a local memory. For this alternative, the BFP parameter generator 640 may provide a compression control parameter for selecting the new quantization profile.

Figure 13:
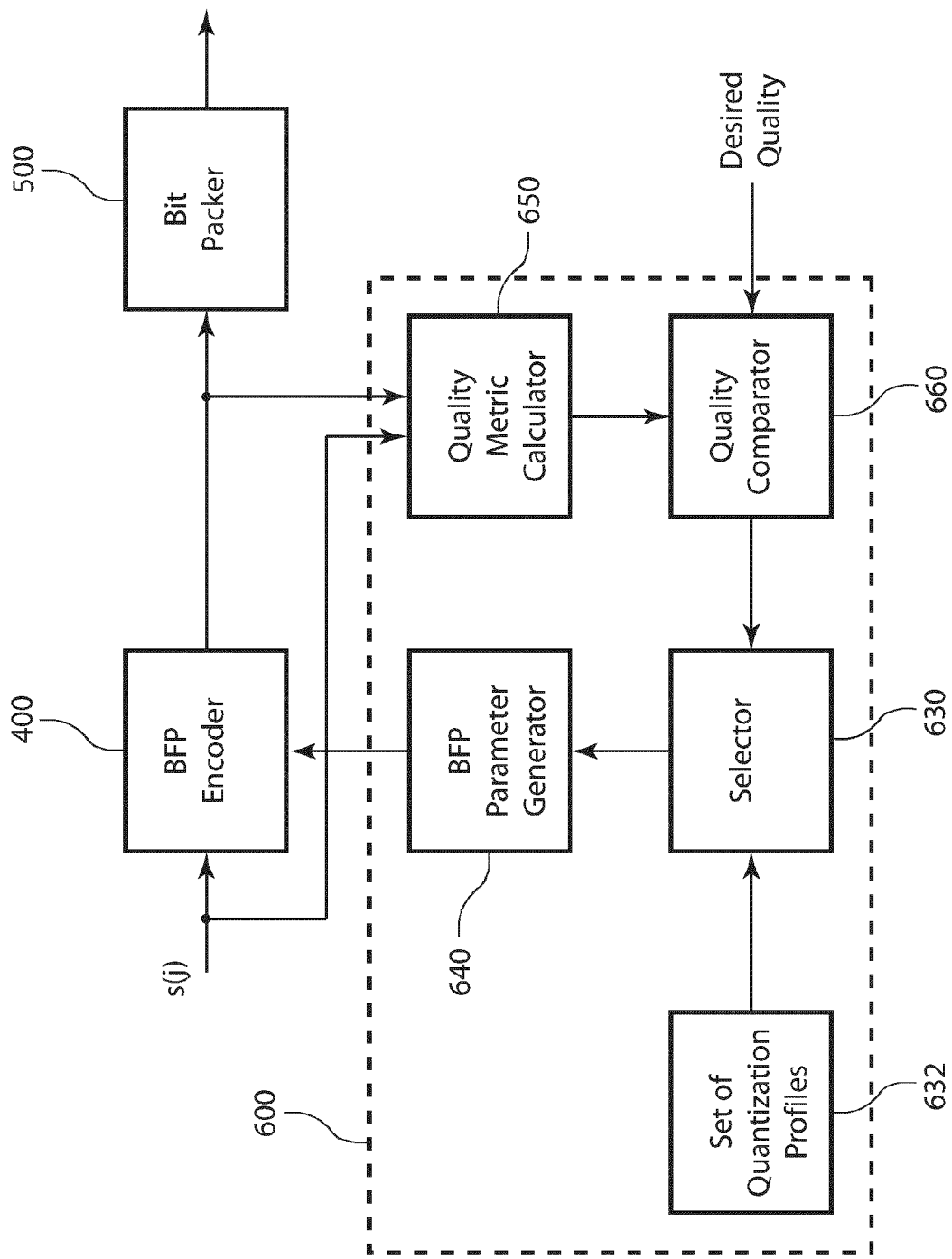
FIG. 13 is a block diagram of feedback control to the BFP encoder for a fixed quality metric of the compressed data.

FIG. 13 is a block diagram of feedback control to the BFP encoder 400 for a fixed quality metric of the compressed data. The quality metric calculator 650 computes a quality metric such as average error, SNR, or other measure of distortion. In a preferred embodiment, the quantization error QE(j) is calculated in accordance with equation (2) and averaged over one or more compressed packets to produce an average error. The quality metric calculator 650 may compute the average signal power for the corresponding signal samples s(j) to produce a measured SNR. The quality comparator 660 compares the measured quality metric, such as average error of SNR, to the desired quality. If the measured quality metric is outside the tolerance range, the selector 630 selects a new quantization profile for determining the compression control parameters. The tolerance range for the quality metric is defined by the user and may be zero or may fall within a range of difference values. The BFP parameter generator 640 provides the new compression control parameters to the BFP encoder 400 as described above with respect to FIG. 12.

The bit packer 500 forms compressed packets from the compressed groups produced by the BFP encoder 400, such as the compressed group 410 of FIG. 2 or the compressed group 418 of FIG. 10. The bit packer 500 concatenates a number of compressed groups to form the data portion of a compressed packet. An example of the data portion of a compressed packet is described above with respect to FIG. 7. The bit packer 500 produces a header preceding the data portion of the compressed packet. The header may include information related to synchronization, number of samples represented by the packet, number of bytes in the packet, encoded compression control parameters, quantization profile, and other identifying information. This information is represented in fields having fixed bit widths in the header in accordance with the user-defined protocol. When the BFP encoding depends on a quantization profile to encode the compressed blocks, the compression control parameters in the header may include an index corresponding to the quantization profile or the parameters of the quantization profile itself. To support decompression, the packet header is decoded to regenerate the parameters for decoding of the compressed blocks of the data portion and to re-sequence the decompressed samples.

Figure 14:
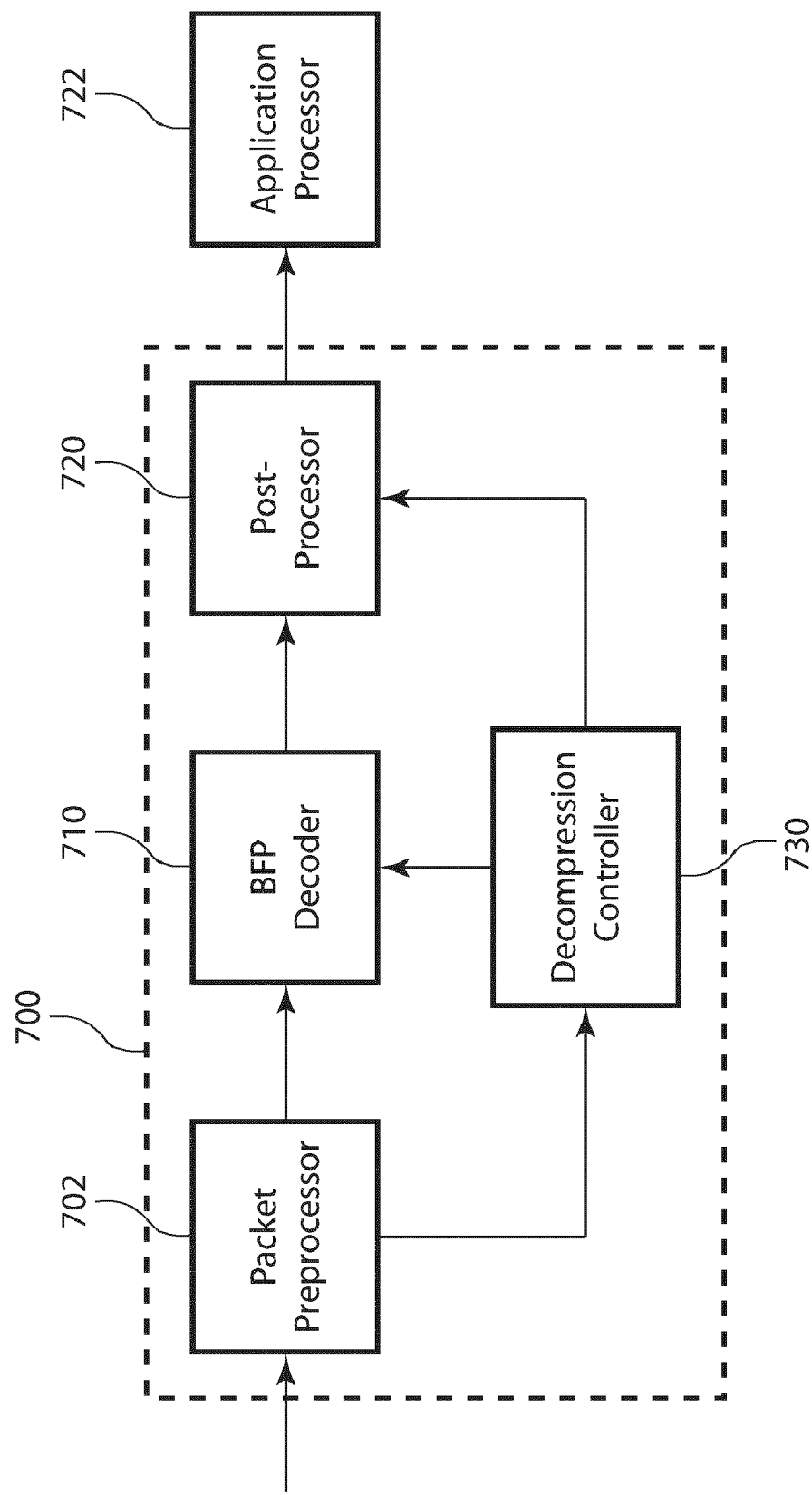
FIG. 14 is a block diagram of a signal processing system that decompresses the compressed packets using block floating point decoding.

FIG. 14 is a block diagram of a signal processing system that decompresses the compressed packets using block floating point decoding. The decompressor 700 receives an input signal comprising the compressed packets and provides the decompressed samples to the application processor 722 for the signal processing operations specific to the application. The packet preprocessor 702 separates the header and data portion of each compressed packet and provides the data portion containing the compressed data to the BFP decoder 710. The packet preprocessor 702 decodes the encoded parameters in the header and provides them to the decompression controller 730. The BFP decoder decompresses the compressed groups of the packet in accordance with the decoded compression control parameters to form N_GROUP decoded samples corresponding to each compressed group. The post-processor 720 re-sequences the groups of decoded samples and may perform other operations to reconstruct the corresponding signal samples. For example, if the preprocessor 300 calculated first or higher order derivatives of the sampled signal 201 prior to block floating point encoding, the post-processor 720 will calculate the first or higher order integrals of the decoded samples to reconstruct the sampled signal.

Figure 15:
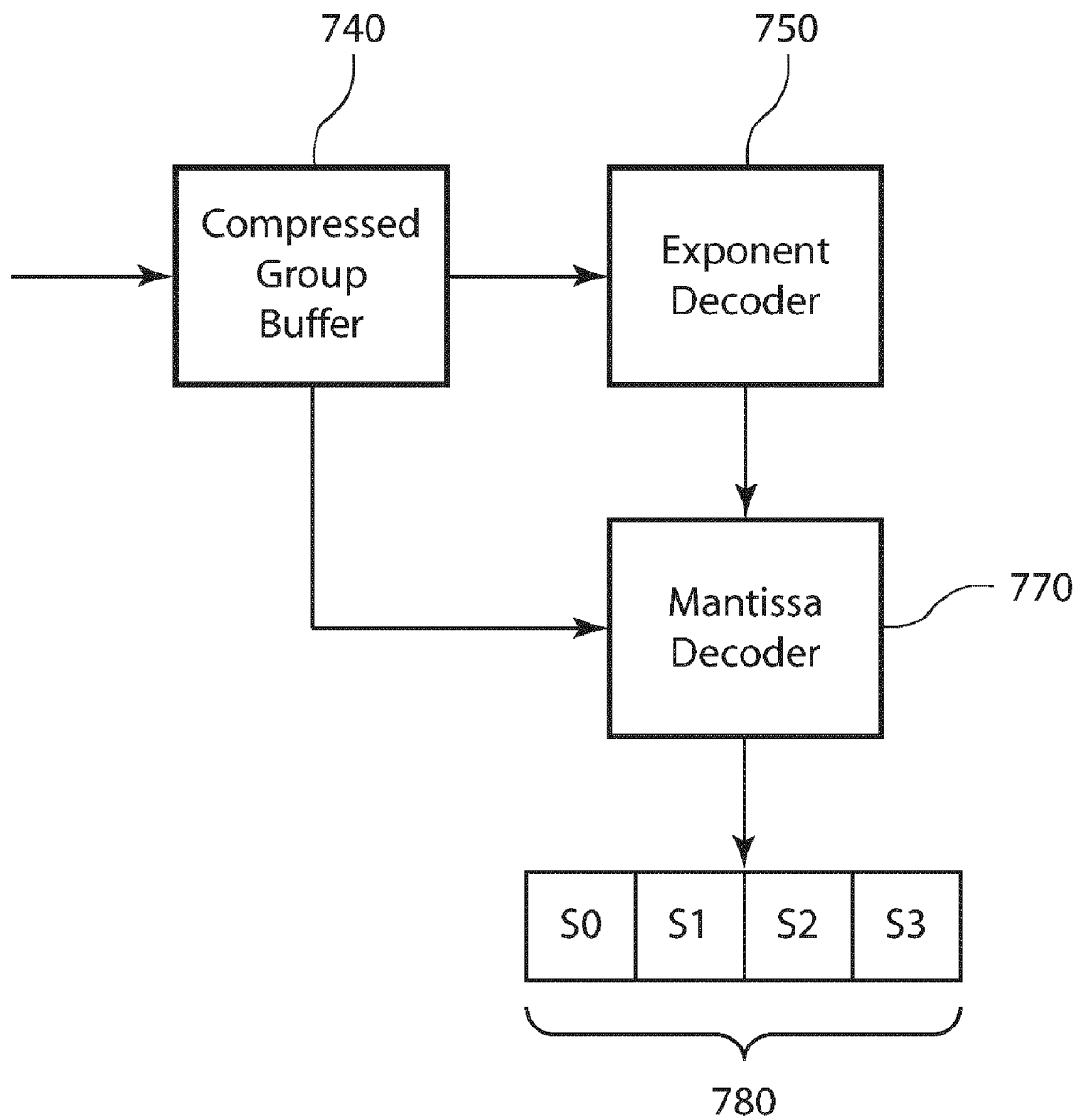
FIG. 15 is a block diagram of block floating point decoder operations for decompressing a compressed group having n_exp bits per encoded mantissa.

FIG. 15 is a block diagram of block floating point decoder 710 operations for decompressing a compressed group having n_exp bits per encoded mantissa. The compressed group buffer 740 receives the exponent token and mantissas for N_GROUP compressed samples corresponding to the compressed group 410 in FIG. 2. The exponent decoder 750 decodes the exponent token using the code table of FIG. 4 to provide the exponent value n_exp, as described below. The exponent value n_exp indicates the number of bits representing each of the N_GROUP mantissas. The mantissa decoder 770 maps each mantissa to a sample having the appropriate number of higher order bits (typically sign extension bits) and lower order bits (n_LSB bits) to restore the sample representation to the original number of bits or other number of bits to comply with the data format of the destination processor. The mantissa decoder 770 produces the decompressed group 780, where the decompressed samples S0 to S3 correspond to the packed mantissas 412-0 to 412-3 in FIG. 2.

Figure 16:
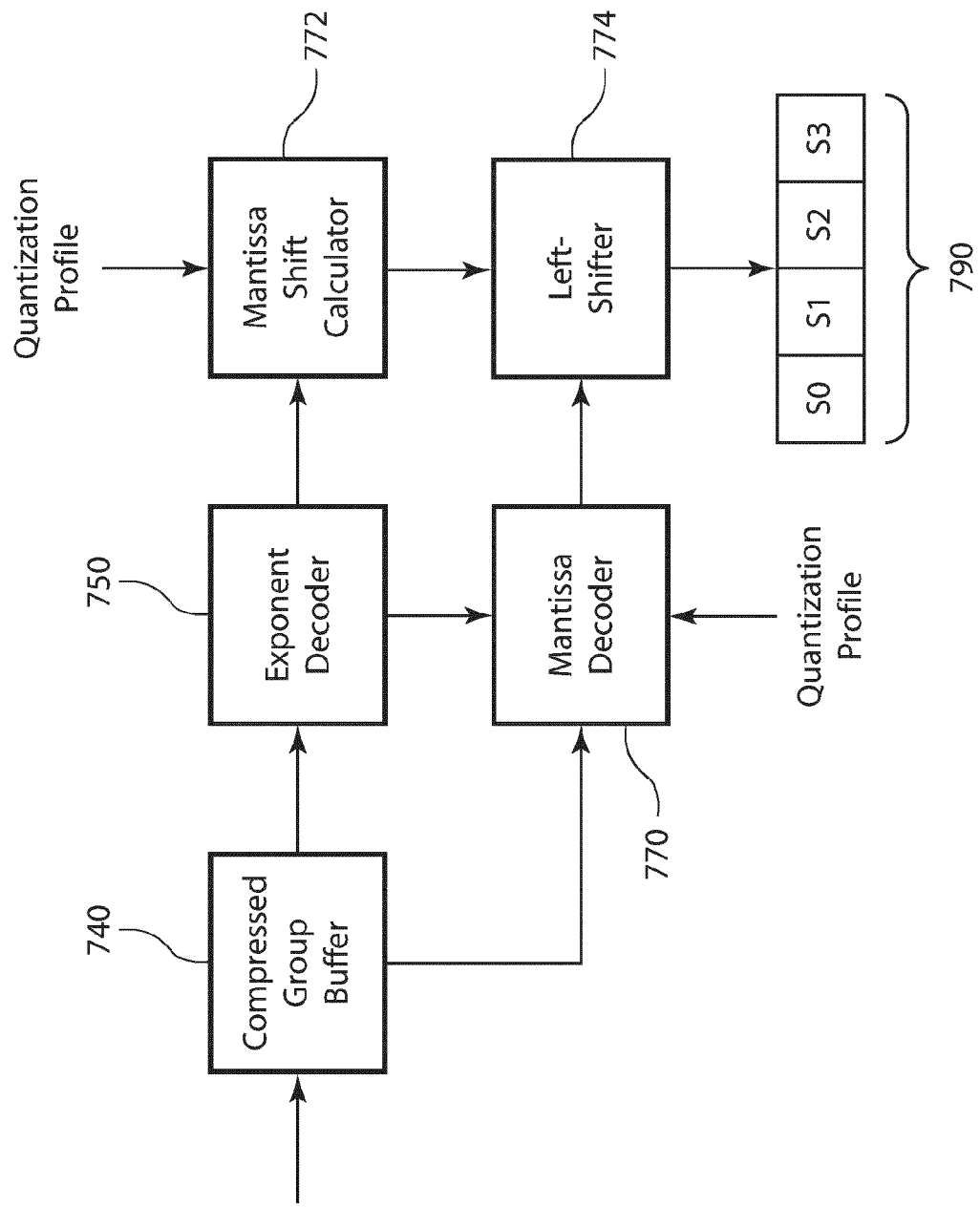
FIG. 16 is a block diagram of the block floating point decoder operations for decompressing a compressed group having m_exp bits per encoded mantissa.

FIG. 16 is a block diagram of the block floating point decoder 710 operations for decompressing a compressed group having m_exp bits per encoded mantissa. The compressed group buffer 740 receives the compressed group corresponding to compressed group 418 in FIG. 10. The exponent decoder 750 decodes the exponent token using the code table of FIG. 4 to provide the exponent value n_exp, as described below. The mantissa decoder 770 uses the exponent value n_exp and the quantization profile to determine the parameter m_exp that indicates the number of bits per reduced mantissa 419-0 to 419-3. The mantissa decoder 770 maps the mantissa to a sample having the appropriate number of higher order bits. The mantissa shift calculator 772 uses the exponent value n_exp to determine the n_LSB parameter based on the quantization profile. In a preferred embodiment, the left-shifter 774 shifts the mantissa by n_LSB bits, appending zeros in the LSB positions, to produce the corresponding decompressed sample. An alternate embodiment of left-shifter 774 fills the n_LSB bits with a fixed value (such as a '1' followed by n_LSB-1 zeros that generates a quantization error having a predictable average value), or with random bits. The resulting decompressed group 790 includes N_GROUP decompressed samples S0-S3 corresponding to packed mantissas 419-0 to 419-3 in FIG. 10. The decompression controller 730 provides the parameters corresponding to the quantization profile recovered from the packet header to the mantissa decoder 770 and the mantissa shift calculator 772.

Figure 17:
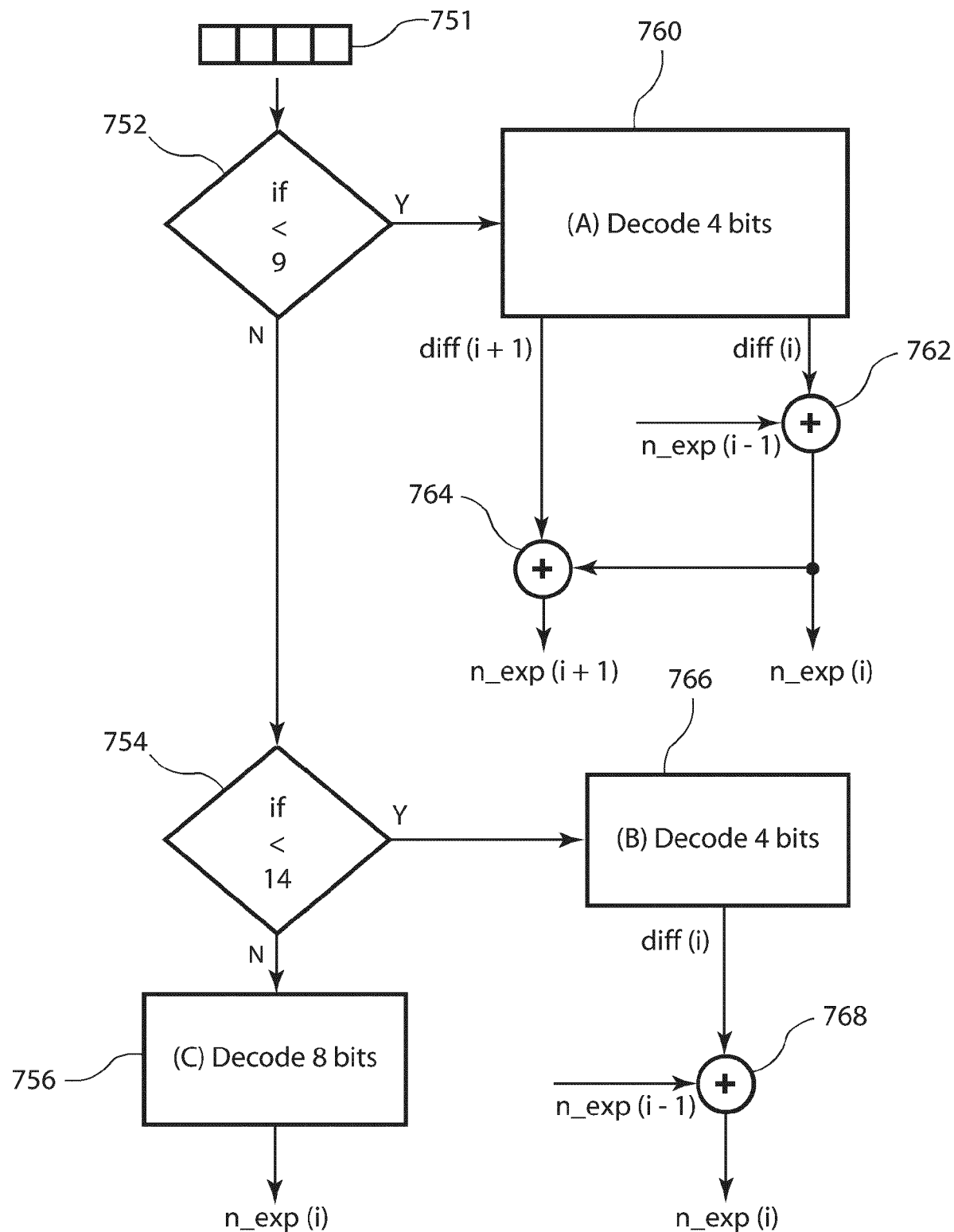
FIG. 17 is a block diagram of the exponent decoder in accordance with the code table of FIG. 4.

FIG. 17 is a block diagram of the exponent decoder 750 in accordance with the code table of FIG. 4. For this embodiment, the exponent decoder 750 applies tests to determine if the exponent token represents jointly encoded exponent differences (option A), a single encoded exponent difference (option B) or an absolute encoded exponent (option C) for exponent tokens encoded as described with respect to FIG. 5. The exponent decoder 750 tests the lower four bits of the exponent token 501. The decision block 752 tests if the value of the lower four bits of the exponent token 751 is less than 9. If so, the exponent token 501 represents jointly encoded exponent differences in accordance with option A. The decode block 760 decodes the four bits of the exponent token 751 to determine the consecutive difference values diff(i) and diff(i+1). These are used to calculate the consecutive exponent values n_exp(i) and n_exp(i+1). The adder 762 adds the diff(i) to the previously calculated exponent value n_exp(i−1) to compute the $i^{th}$ exponent value n_exp(i). The adder 764 adds the difference value diff(i+1) to the $i^{th}$ exponent value n_exp(i) to compute n_exp(i+1). The decision block 754 tests if the lower four bits of the exponent token 751 are less than 14. If so, the exponent token 501 represents an encoded exponent difference in accordance with option B. The decode block 766 decodes the four bits to determine the difference value diff(i). The adder 768 adds the difference value diff(i) to the previously calculated exponent value n_exp(i−1) to determine the $i^{th}$ exponent value n_exp(i). If results of the decision blocks 752 and 754 were negative for the lower four bits of the exponent token 751, then the exponent token has four additional bits for a total of eight bits and represents an absolute encoded exponent in accordance with option C. The decode block 756 decodes the 8-bit exponent token to determine the exponent value n_exp(i).

Figure 18:
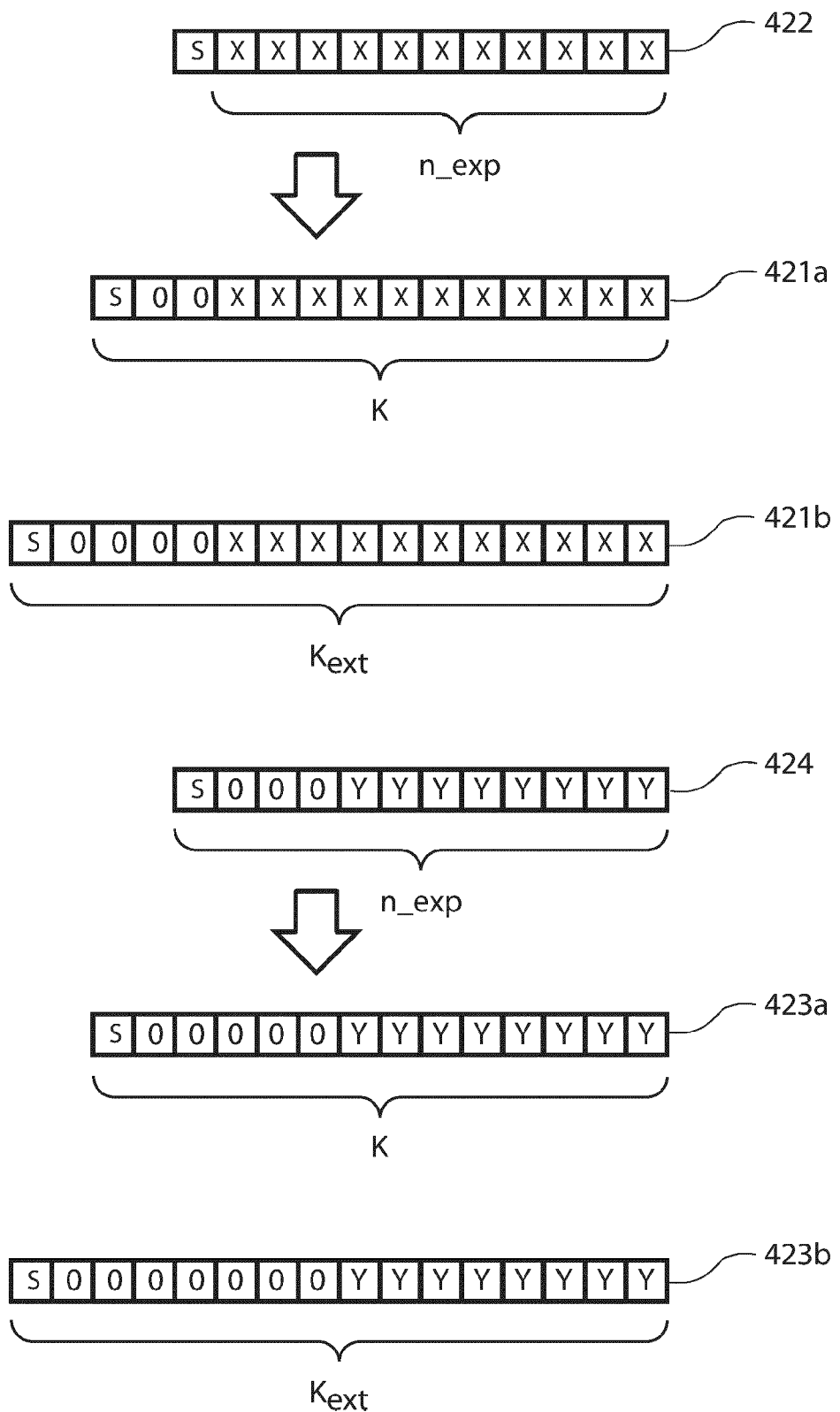
FIG. 18 is an example of decompressing the compressed samples described with respect to FIG. 3b.

FIG. 18 is an example of decompressing the compressed samples described with respect to FIG. 3b. The mantissa decoder 770 uses the exponent value n_exp to identify the mantissa bits and sign bit of each of the compressed samples 422 and 424. The mantissa decoder 770 maps n_exp mantissa bits and the sign bit to the respective decompressed samples 421a and 423a, each having the original number of bits K. Alternatively, the mantissa decoder 770 may map the mantissas to a different bit width than that of the original signal samples to form decompressed samples 421b and 423b, respectively, each having an extended number of bits $K_{ext}$. In this example, the higher order bits in the decompressed samples 421a, 421b, 423a and 423b are zeros, corresponding to a sign-magnitude representation. Alternatively, one or more of the higher order bits may be sign extension bits, depending on the desired data representation of the destination processor.

Figure 19:
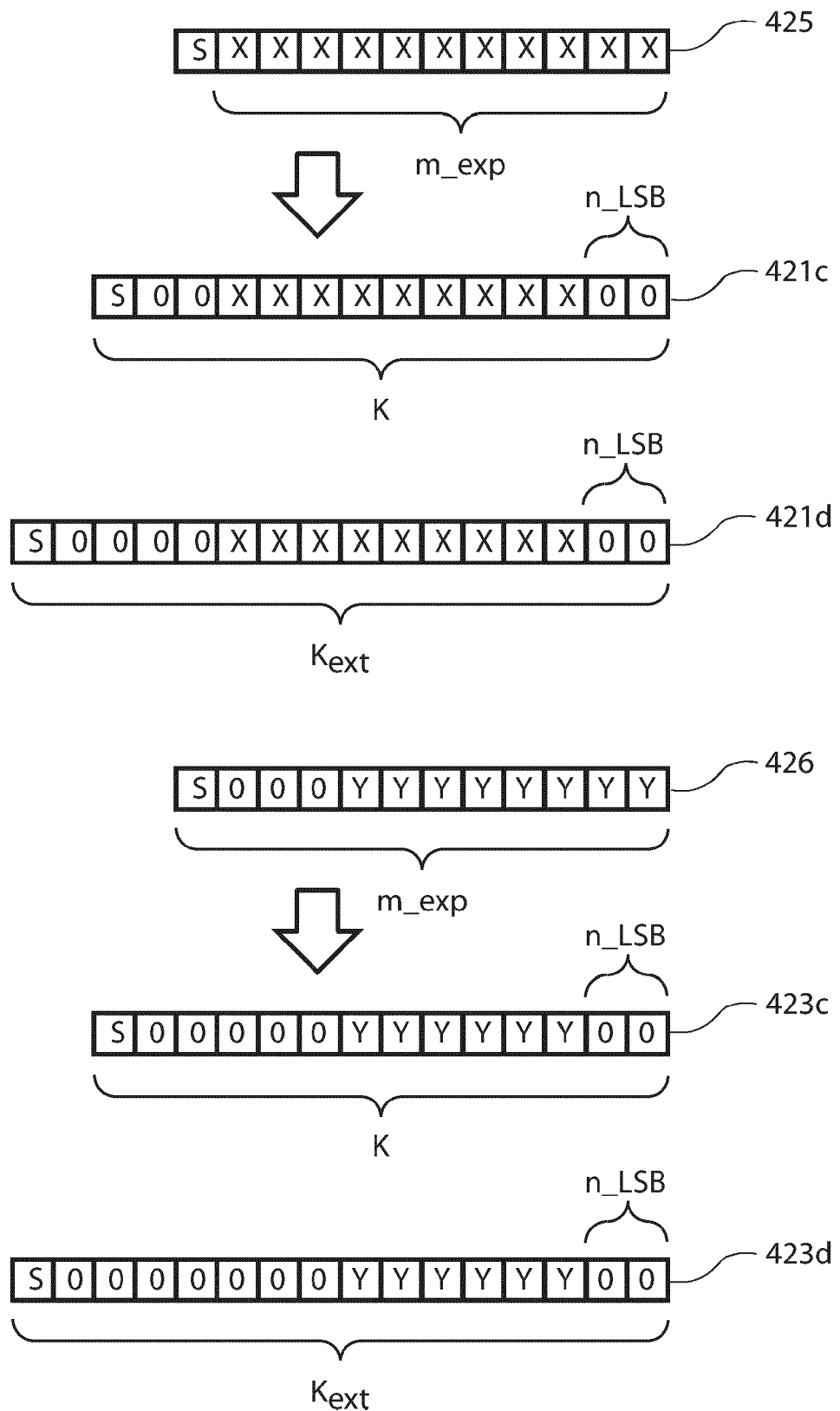
FIG. 19 is an example of decompressing the compressed samples described with respect to FIG. 8b.

FIG. 19 is an example of decompressing the compressed samples described with respect to FIG. 8b. The mantissa decoder 770 uses the parameter m_exp to identify the mantissa bits and sign bit of the compressed samples 425 and 426. The mantissa decoder 770 maps the m_exp mantissa bits and the sign bit to a K-bit sample. The left-shifter 774 shifts the bits left by n_LSB to produce the decompressed samples 421c and 423c, respectively. Alternatively, the mantissa decoder 770 and left-shifter 774 may form decompressed samples 421d and 423d, respectively, each having an extended number of bits $K_{ext}$. Alternatively, one or more of the higher order bits may be sign extension bits, depending on the desired data representation of the destination processor.

The compressor 110 and the decompressor 700 of the present invention are not limited by the particular data representation format of the samples. The data representation formats can include sign-magnitude, sign extended, two's complement and unsigned integers. The data representation format may also include the mantissas or exponents (or both) of a 32-bit, 64-bit, or 128-bit value in a standard floating-point format, such as described in the standards IEEE-754-1985 or IEEE 754-2008. The samples input to the block floating point encoder 400 or preprocessor 300 may have a different data representation format than that of the decompressed samples output from the block floating point decoder 710 or postprocessor 720. The user may determine the data representation formats to meet requirements of the data processor system for the particular application.

The compressor 110 applies simple operations to the signal samples output from the ADC 200. The block floating point encoding uses comparators, subtractors and lookup tables. The decompressor applies simple operations to decompress the compressed packets. The block floating point decoding decompressor includes lookup tables, adders and shifters. Because of the simple operations, the compressor 110 and the decompressor 700 can be implemented to operate in real time, or at least as fast as the sample rate of the ADC 200, in signal processing applications including wireless communications, radar, ultrasound, raw computed tomography data and other raw data for other imaging modalities.

Embodiments of compressor 110 include integrating the ADC 200 and the compressor 110 in a single application specific integrated circuit (ASIC) device. The implementation of the compressor 110 includes at least the BFP encoder 400 and the bit packer 600. The compression controller 600 may be implemented in the ASIC or in a microcontroller. Depending on the application the compressor 110 may also include the preprocessor 300. Alternative architectures may implement the compressor 110 in a separate device from the ADC 200. The compressor 110 can be implemented by an ASIC, FPGA or a programmable processor, such as a digital signal processor (DSP), microprocessor, microcontroller, multi-core CPU (such as IBM Cell), or graphics processing unit (GPU; such as Nvidia GeForce).

The decompressor 700 may be incorporated into the same device as or a different device from the application processor 722. The decompression operations can be implemented in an ASIC or FPGA. The decompressor 700 may be incorporated into a digital-to-analog converter (DAC), where the DAC replaces the application processor 722 in FIG. 14. Alternatively, the decompression operations can be implemented in software or firmware programs executable by a programmable processor, such as a DSP, microprocessor, microcontroller, CPU or GPU. The preferred implementation of the decompressor 700 is a software program having instructions for the decompression operations executable by a GPU. The GPU may also be programmed to implement at least a portion of the operations of the application processor 722. Alternatively, the decompressed samples may be transferred to another programmable processor, such as a CPU, for the additional signal processing operations for the application.

Figure 20:
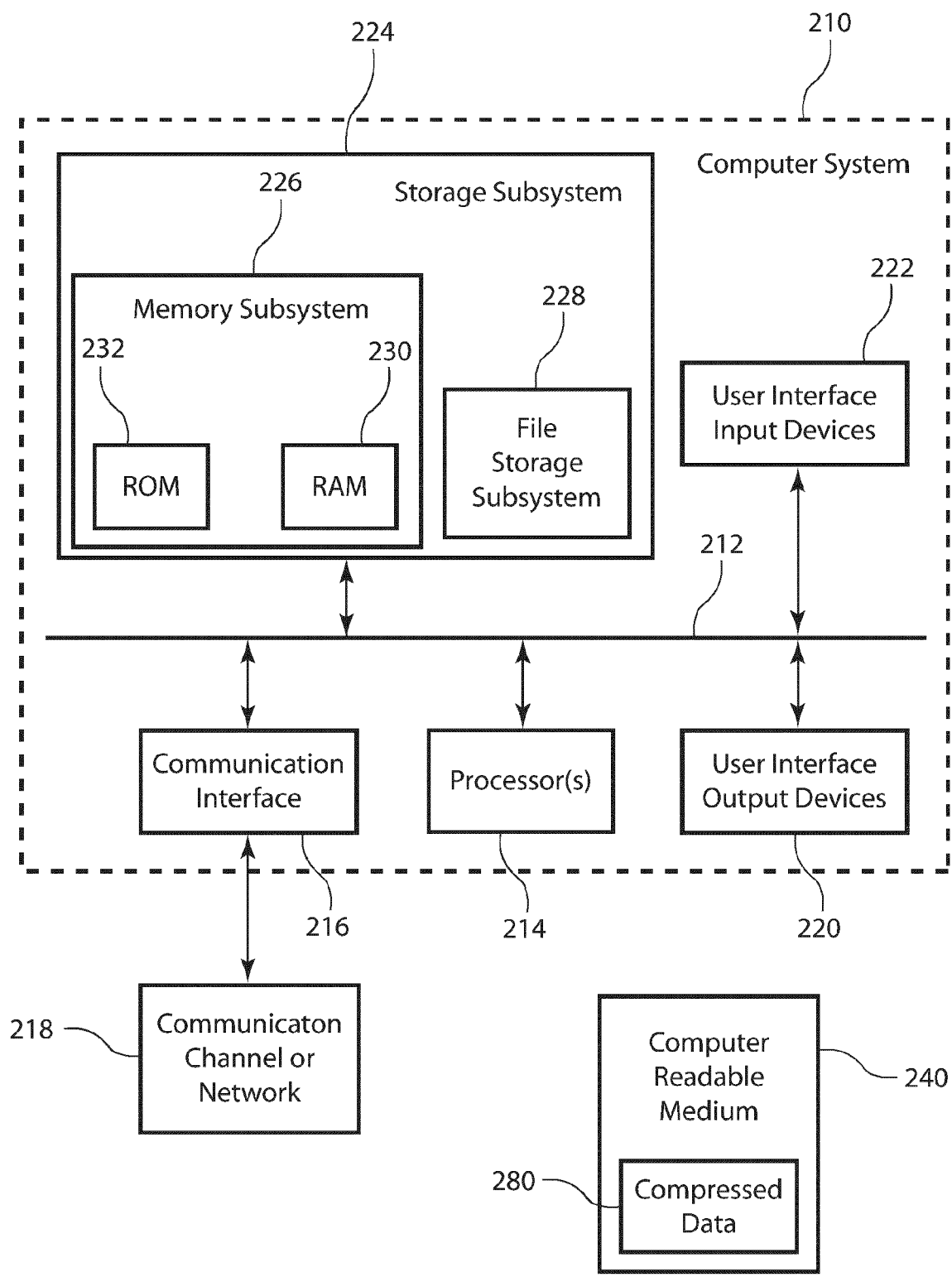
FIG. 20 is a simplified block diagram of a computer system 210 suitable for use with embodiments of the technology.

FIG. 20 is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a communication interface subsystem 216. The input and output devices allow user interaction with computer system 210. Communication interface subsystem 216 provides an interface to communication channel or network 218, which may be a single channel or a communication network having multiple channels. The communication channel or network 218 is coupled to corresponding interface devices in other computer systems, transmitting or receiving devices, or an outside network. The communication channel or network 218 may comprise wireline links, optical links, wireless links, or any other mechanisms for communication of information. The communication network 218 may comprise many interconnected computer systems and communication links. While in one embodiment, communication network 218 is the Internet, in other embodiments, the communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that may provide the functionality of some or all of the compressor 110 and/or the decompressor 700 described herein. These software modules are generally executed by processor 214. The processor(s) 214 may include one or more of a DSP, microprocessor, microcontroller, CPU or GPU. The processor(s) 214 may also include dedicated ASIC or FPGA logic, as described above, implementing some or all of the functionality of the compressor 110 or the decompressor 700.

Memory subsystem 226 typically includes a number of memories including a main random access memory (RAM)

230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with communication interface subsystem 216. The computer readable medium 240 can be a hard disk, a floppy disk, a CD-ROM, an optical medium, removable media cartridge, or electromagnetic wave. The computer readable medium 240 is shown storing a compressed data file 280. The computer readable medium may also store programs implementing the functionality of the compressor 110 and/or the decompressor 700.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 20 is intended only as a specific example for purposes of illustrating the preferred embodiments. Many other configurations of computer system 210 are possible having more or less components than the computer system depicted in FIG. 20.

Figure 21:
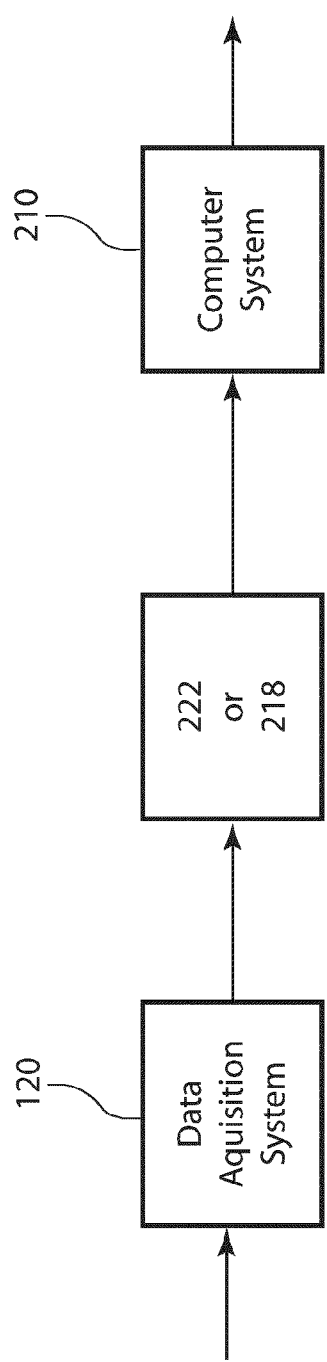
FIG. 21 is a generalized block diagram of a data processing system for capturing and processing signal data used in a variety of applications.

Embodiments of the present invention can compress signal samples of a variety of signal types and applications, including communications, ultrasound, radar and sensors. The compression of the present invention can be applied to signals produced by data acquisition systems for imaging, including raw data for computed tomography (CT) and magnetic resonant imaging (MRI). Data processing systems for these types of applications generally include a signal acquisition and processing system for capturing signal data, also referred to as a data acquisition system (DAS). The captured signal data may be transferred to a computer system 210 for storage and application processing. FIG. 21 is a generalized block diagram of a data processing system for capturing and processing signal data used in a variety of applications. The data acquisition system 120 includes sensors and processing elements for the particular application. For example, for ultrasound and sonar, the data acquisition system 120 includes ultrasonic transducer elements for converting the received acoustical signals to analog electrical signals. For an x-ray imaging instrumentation, including a CT DAS, the data acquisition system 120 includes x-ray sensors for producing electrical signals from detected x-ray radiation. For a communications, radar or a MRI DAS, the data acquisition system 120 includes antenna and receiver subsystems to convert collected electromagnetic radiation to an analog signal. For digital processing of the collected data, the data acquisition system 120 includes an ADC 200 to sample the analog signal. The signal samples may be transferred to the computer system 210 via interfaces 222 or 218, depending on the architecture of the application system. The computer system 210 performs application specific processing and/or storage of the received signal samples and/or storage of the processing results. For applications such as ultrasound, sonar, radar, CT and MRI, the processor(s) 214 may apply imaging calculations to form two-dimensional or three-dimensional images for the display subsystem 220. For communications applications, the processor 214 may apply demodulation operations to the signal samples to form an output for the user interface output device 220 and/or process the signal samples for transfer via a communication network 218 to another destination. For these applications and others that use the general architecture of FIG. 21, integrating the compressor 110 into the of the data acquisition and processing system 120 reduces bandwidth requirements for interfaces 222 or 228 and conserves storage subsystem resources 224 of the computer system 210. The processor(s) 214 may include a dedicated processor to implement the decompressor 700 to decompress the compressed data prior to processing for the applications.

Figure 22:
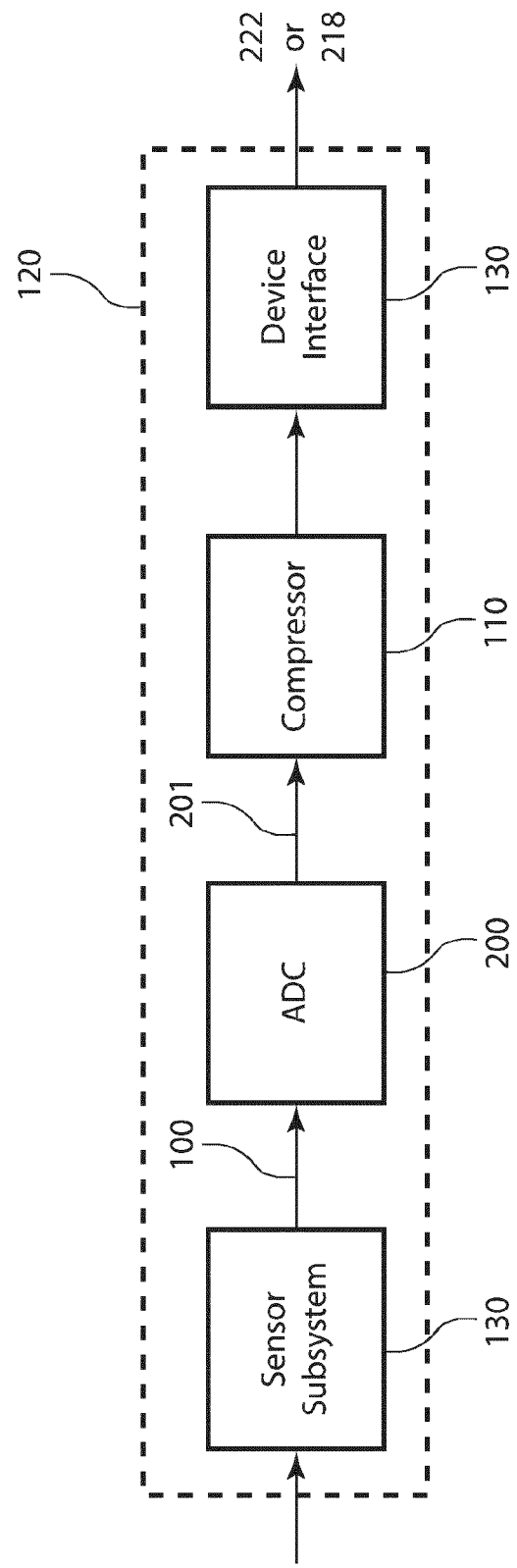
FIG. 22 is a block diagram of the data acquisition system 120 including compression.

FIG. 22 is a block diagram of the data acquisition system 120 including compression. The sensor subsystem 130 comprises the detectors, transducers and/or receivers that operate for the application to convert the received waveform of the particular modality to an analog signal 100. The ADC 200 samples the analog signal 100 and the compressor 110 compresses the signal samples, as described with respect to FIG. 1. The device interface 130 provides the compressed data to the interfaces 218 or 222 for transfer to the computer system 210. The processors 214 decompress the received compressed data and perform the application specific processing, as described with respect to FIG. 14. The computer system 210 may store the received compressed data in the file storage subsystem 228 for later decompression and application processing.

For some applications, the computer system 210 may compress signal samples prior to transfer to the storage subsystem 224, the communication channel 218 or the user interface output devices 220. For example, the transfer of image data to the user interface output device 220, such as an output display device or a printer, can consume bandwidth and memory embedded in the output device 220. Often, a printer is a shared resource for a network of computers in an office or a home, so that scanned or rastered image samples are transferred via the network 218 to the printer. Processing image data destined for a display device or printer may include scanning or rastering the two-dimensional image data to one-dimensional sequence of scanned image samples. The processor 214 can apply the compressor 110 prior to transfer to the output display device 220 or via the communication network 218 to the shared printer. In this case the rastered image samples are the signal samples input to the compressor 110. The decompressor 700 embedded in the output display device 220 decompresses the compressed scanned samples prior to the operations for displaying or printing the two-dimensional image.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. A method for compressing a plurality of signal samples, where the signal samples consist of a number of bits per sample, comprising:

grouping the plurality of signal samples received in a processor into a sequence of encoding groups;

for an encoding group in the sequence of encoding groups, determining a block exponent value for the encoding group, and determining a mantissa for each signal sample in the encoding group, the mantissa having a number of bits based on said block exponent value for the encoding group;

for the sequence of encoding groups, encoding the block exponent values for the encoding groups to determine exponent tokens for the encoding groups in the sequence, wherein an exponent token represents one or more block exponent values for one or more encoding groups in the sequence, including determining differences between block exponent values for consecutive encoding groups in the sequence;

encoding the determined differences to produce the exponent tokens for at least a portion of the consecutive encoding groups;

providing a predetermined set of exponent token codes, the exponent token codes in the predetermined set encoding respective differences between block exponent values in more than two consecutive encoding groups;

if the determined differences in the block exponent values for more than two consecutive encoding groups in the sequence match one of the exponent token codes in the predetermined set, then representing the block exponent values for more than one of the encoding groups in the consecutive encoding groups using said one of the exponent token codes; and encoding the plurality of signal samples using the exponent tokens and the mantissas for the sequence of encoding groups to form compressed data for storage in a storage device or transmission from the processor.

2. The method of claim 1, including forming a compressed data set by arranging the exponent tokens for individual encoding groups adjacent to the mantissas arranged in series for the signal samples in the individual encoding groups.

3. The method of claim 1, including forming a compressed data set by arranging the exponent tokens in series for a plurality of encoding groups in the sequence and arranging the mantissas in series for the signal samples in the plurality of encoding groups.

4. The method of claim 1, wherein said block exponent value is based on a place value of a most significant non-zero bit in a signal sample having a maximum magnitude within the encoding group.

5. The method of claim 1, wherein the predetermined set of exponent token codes further includes exponent token codes to encode respective differences between block exponent values in two consecutive encoding groups, wherein said encoding the block exponent values further comprises: if the determined difference between the block exponent values for two consecutive encoding groups in the sequence matches one of the exponent token codes in the predetermined set, then representing the block exponent value for one of the encoding groups in the two consecutive encoding groups using said one of the exponent token codes.

6. The method of claim 1, wherein said determining a mantissa includes specifying a number of least significant bits (LSBs) for removal from signal samples in the encoding group, and wherein the mantissas for signal samples in the encoding group comprise a number of bits equal to the block exponent value for the encoding group less the specified number of least significant bits.

7. The method of claim 6, wherein said specifying a number of LSBs is specified based on the block exponent value for the encoding group.

8. The method of claim 6, wherein said specifying a number of least significant bits is specified based on a desired bit rate for the compressed data.

9. The method of claim 6, wherein said specifying a number of least significant bits is specified based on a desired quality metric for the compressed data.

10. The method of claim 1, wherein each signal sample includes a sign bit, wherein said determining a mantissa includes appending the sign bit of each signal sample with the determined mantissa.

11. The method of claim 1, including using the processor in a signal processing system to perform the steps of a claim, the signal processing system including an analog to digital converter that receives an analog signal, the method further comprising:

converting the analog signal to the plurality of signal samples provided for the step of grouping.

12. The method of claim 1, including receiving the plurality of signal samples using a receiver in a data communication channel, the receiver providing the signal samples to the processor.

13. The method of claim 1, wherein the plurality of signal samples is stored in a data storage system in communication with the processor, the processor reading the plurality of signal samples from the data storage system.

14. A method for decompressing an input signal conveying compressed data to a processor representing a plurality of encoded original signal samples, the method comprising:

disassembling the compressed data received at the processor to obtain a plurality of exponent tokens and a plurality of compressed groups of mantissas, where the plurality of the encoded original signal samples are represented by the exponent tokens and the mantissas;

decoding the plurality of exponent tokens to form a plurality of block exponent values, wherein each block exponent value is associated with one of the plurality of compressed groups, wherein a portion of the plurality of exponent tokens encodes differences between block exponent values associated with consecutive compressed groups, the decoding the plurality of exponent tokens further comprising:

providing a predetermined set of exponent token codes, the exponent token codes in the predetermined set encoding respective differences between block exponent values associated with consecutive compressed groups;

for a given exponent token, using the predetermined set to decode one or more differences represented by the given exponent token;

for each decoded difference, adding the decoded difference to a previous block exponent value to determine the block exponent value associated with a corresponding one of the consecutive compressed groups;

for each of the compressed groups of mantissas, determining a number of bits representing each of the mantissas in the compressed group using the associated block exponent value, and mapping the number of bits of each mantissa to a corresponding decompressed sample, to form a group of decompressed samples; and applying said determining a number of bits and said mapping the number of bits of each mantissa to the plurality of compressed groups of mantissas to generate a plurality of decompressed samples.

15. The method of claim 14, wherein said determining a number of mantissa bits further comprises:

determining a number of least significant bits (LSBs) based on the associated block exponent value, wherein said mapping includes inserting a bit value of zero or a dithered bit value for the number of LSBs of the corresponding decompressed sample.

16. The method of claim 15, wherein the input signal includes a compression control parameter, the step of determining a number of LSBs further comprises:
- receiving the compression control parameter from the input signal;
- selecting a quantization profile in accordance with the compression control parameter from a plurality of quantization profiles stored in a local memory in communication with the processor, wherein each quantization profile comprises a look-up table or a formula relating respective block exponent values to respective numbers of LSBs; and
- using the selected quantization profile to determine the number of LSBs based on the associated block exponent value.

17. The method of claim 14, including using a data processor to perform said disassembling, decoding, determining, mapping and applying.

18. The method of claim 14, including receiving the input signal using a receiver in a data communication channel, the receiver providing the input signal to the processor.

19. The method of claim 14, including retrieving the input signal from a data storage system in communication with the processor.

20. An apparatus for compressing a plurality of signal samples, where the signal samples consist of a number of bits per sample, comprising a processor and a memory in communication with the processor, the processor including:
- logic for grouping the signal samples into a sequence of encoding groups, to form a sequence of encoding groups;
- logic determining a block exponent value for each encoding group;
- a mantissa encoder that receives the signal samples in each encoding group and forms a mantissa for each signal sample, wherein each mantissa of a particular encoding group has a number of bits based on the block exponent value for the particular encoding group;
- an exponent encoder that encodes the block exponent values for the sequence of encoding groups to produce exponent tokens, wherein an exponent token represents one or more block exponent values for one or more encoding groups, the exponent encoder further comprising:
- a difference calculator determining differences between the block exponent values associated with consecutive compressed groups, the exponent encoder encoding the determined differences to produce corresponding exponent tokens;
- a predetermined set of exponent token codes stored in the memory, the exponent token codes in the predetermined set encoding respective differences between block exponent values for more than two consecutive encoding groups;
- logic determining if the determined differences between block exponent values for more than two consecutive encoding groups in the sequence match one of the exponent token codes in the predetermined set, and if so, selecting said one of the exponent token codes to represent the block exponent values for more than one of the encoding groups in the consecutive encoding groups; and
- a bit packer arranging the exponent tokens and the mantissas for the sequence of encoding groups to form compressed data for storage in a storage device or transmission from the processor.

21. The apparatus of claim 20, wherein the bit packer further comprises:
- a multiplexer that arranges the exponent tokens for individual encoding groups adjacent to the mantissas arranged in series for the signal samples in the individual encoding groups to form a compressed data set.

22. The apparatus of claim 20, wherein the bit packer further comprises:
- a multiplexer that arranges the exponent tokens in series for a plurality of encoding groups in the sequence and arranges the mantissas in series for the signal samples in the plurality of encoding groups to form a compressed data set.

23. The apparatus of claim 20, wherein the block exponent value is based on a place value of a most significant non-zero bit in a signal sample having a maximum magnitude within the encoding group.

24. The apparatus of claim 20, wherein the predetermined set of exponent token codes further includes exponent token codes to encode respective differences between block exponent values for two consecutive encoding groups, wherein the exponent encoder further comprises logic determining if the determined difference between the block exponent values for two consecutive encoding groups in the sequence matches one of the exponent token codes in the predetermined set, and if so, selecting said one of the exponent token codes to represent the block exponent value for one of the encoding groups in the two consecutive encoding groups.

25. The apparatus of claim 20, wherein the mantissa encoder specifies a number of least significant bits (LSBs) for removal from signal samples in each encoding group, wherein each mantissa of a particular encoding group has a number of bits equal to the block exponent value less the specified number of least significant bits.

26. The apparatus of claim 25, the mantissa encoder further including a quantization profile stored in the memory, the quantization profile comprising a look-up table or a formula relating respective block exponent values to respective numbers of LSBs, the mantissa encoder using said quantization profile to specify the number of LSBs based on the block exponent value for the encoding group.

27. The apparatus of claim 26, further comprising a compression controller providing a compression control parameter to the mantissa encoder, wherein a plurality of quantization profiles are stored in the memory, the mantissa encoder selecting one of the quantization profiles in accordance with the compression control parameter.

28. The apparatus of claim 27, wherein the compression controller determines the compression control parameter based on a desired bit rate for the compressed data.

29. The apparatus of claim 27, wherein the compression controller determines the compression control parameter based on a desired quality metric for the compressed data.

30. The apparatus of claim 20, further comprising:
- an analog to digital converter coupled to receive an analog signal and converting the analog signal to the plurality of signal samples provided to the processor.

31. An apparatus for decompressing an input signal conveying compressed data representing a plurality of encoded original signal samples, comprising a processor and a memory in communication with the processor, the processor including:
- a buffer receiving the compressed data, wherein the plurality of encoded original signal samples are represented by a plurality of exponent tokens and a plurality of compressed groups of mantissas;

logic coupled to the buffer for disassembling the compressed data to obtain the plurality of exponent tokens and the plurality of compressed groups of mantissas;

an exponent decoder receiving the plurality of exponent tokens and determining a plurality of block exponent values, wherein each block exponent value is associated with one of the compressed groups of mantissas, wherein a portion of the plurality of exponent tokens encode differences between block exponent values associated with consecutive compressed groups, the exponent decoder further comprising:

a predetermined set of exponent token codes stored in the memory, the exponent token codes in the predetermined set to encode respective differences between block exponent values for consecutive compressed groups, the exponent decoder using the predetermined set to decode one or more differences represented by a received exponent token to obtain one or more decoded differences;

an adder receiving each decoded difference and a respective previous block exponent value and producing the block exponent value for a corresponding one of the consecutive compressed groups; and a mantissa decoder receiving each compressed group of mantissas and the associated block exponent value, wherein a number of bits representing each of the mantissas in the compressed group is based on the associated block exponent value, the mantissa decoder mapping the number of bits of each mantissa to a corresponding decompressed sample to form a group of decompressed samples, the mantissa decoder decoding the plurality of compressed groups to produce a plurality of decompressed samples.

32. The apparatus of claim 31, wherein the mantissa decoder determines a number of least significant bits (LSBs) based on the associated block exponent value and inserts a bit value of zero or a dithered bit value for the number of LSBs of the corresponding decompressed sample.

33. The apparatus of claim 32, wherein the input signal includes a compression control parameter, the apparatus further comprising:

a decompression controller receiving the compression control parameter from the input signal and providing the compression control parameter to the mantissa decoder; and a plurality of quantization profiles stored in the memory coupled to the mantissa decoder, wherein each quantization profile comprises a look-up table or a formula relating respective block exponent values to respective numbers of LSBs, the mantissa decoder selecting one of the quantization profiles in accordance with the compression control parameter, the mantissa decoder using the selected quantization profile to determine the number of LSBs based on the associated block exponent value.

34. The apparatus of claim 31, further including:

a receiver coupled to receive the input signal from a data communication channel and providing the compressed data to the buffer.

35. The apparatus of claim 31, further including:

a data storage system storing the input signal and coupled to provide the compressed data to the buffer.

* * * * *